United States Patent
Oh et al.

(10) Patent No.: US 11,895,774 B2
(45) Date of Patent: Feb. 6, 2024

(54) ELECTRONIC APPARATUS

(71) Applicant: Samsung Display Co., Ltd., Yongin-Si (KR)

(72) Inventors: Jaejin Oh, Gwangju (KR); Junho Kwack, Chungcheongnam-do (KR); Dongjin Park, Seongnam-si (KR); Kyung-Mok Lee, Seoul (KR); Dong-Youb Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 212 days.

(21) Appl. No.: 17/562,493

(22) Filed: Dec. 27, 2021

(65) Prior Publication Data

US 2022/0279654 A1    Sep. 1, 2022

(30) Foreign Application Priority Data

Feb. 26, 2021    (KR) .................. 10-2021-0026201

(51) Int. Cl.
*H05K 1/11*    (2006.01)
*G01R 27/08*    (2006.01)
(Continued)

(52) U.S. Cl.
CPC ............ *H05K 1/118* (2013.01); *G01R 27/08* (2013.01); *H01L 27/124* (2013.01); *H05K 1/0268* (2013.01); *H05K 2201/10128* (2013.01)

(58) Field of Classification Search
CPC .................. H05K 1/118; H05K 1/0268; H05K 2201/10128; H05K 1/111; H05K 1/189;
(Continued)

(56) References Cited

U.S. PATENT DOCUMENTS 8,376,017 B2    2/2013    Lee et al.
8,749,262 B2    6/2014    Jung et al.
(Continued)

FOREIGN PATENT DOCUMENTS

JP    2012-226058    11/2012
KR    10-0891384    4/2009
(Continued)

*Primary Examiner* — Giovanni Astacio-Oquendo
(74) *Attorney, Agent, or Firm* — F. Chau & Associates, LLC

(57) ABSTRACT

An electronic apparatus includes an electronic panel including a plurality of pads, a circuit board including a plurality of leads, and a conductive adhesive member configured to electrically connect the circuit board and the electronic panel. The plurality of pads include a plurality of pixel pads, an arrangement pad, and a resistance measurement pad disposed between the arrangement pad and the pixels pads and insulated from the pixel pads. The plurality of leads include a plurality of pixel leads, an arrangement lead, and a resistance measurement lead disposed between the pixel leads and the arrangement lead and insulated from the pixel leads. The resistance measurement lead includes a plurality of resistance measurement leads disposed between the arrangement lead and the pixel leads and electrically connected with the resistance measurement pad, and a dummy lead spaced apart from the plurality of resistance measurement leads in a plan view.

22 Claims, 16 Drawing Sheets

(51) Int. Cl.
*H01L 27/12* (2006.01)
*H05K 1/02* (2006.01)

(58) Field of Classification Search
CPC .... H05K 3/323; G01R 27/08; G01R 31/2844; G01R 27/025; G01R 31/2825; G01R 31/2863; H01L 27/124; H01L 22/32; H01L 33/62; G02F 1/13458; H10K 59/131
USPC .......................................... 324/691, 649, 600
See application file for complete search history.

(56) References Cited

U.S. PATENT DOCUMENTS

| | | | |
|---|---|---|---|
| 10,615,245 | B2 | 4/2020 | Choi et al. |
| 11,693,458 | B2* | 7/2023 | Oh .......................... G06F 1/183 |
| | | | 361/679.02 |
| 2012/0262886 | A1 | 10/2012 | Yamagishi |
| 2019/0067406 | A1 | 2/2019 | Lee et al. |
| 2019/0348357 | A1 | 11/2019 | Lee et al. |
| 2020/0271979 | A1 | 8/2020 | Roh |
| 2021/0091162 | A1* | 3/2021 | Kim .................... H10K 59/131 |
| 2023/0098663 | A1* | 3/2023 | Lu .......................... H05K 1/118 |
| | | | 257/40 |

FOREIGN PATENT DOCUMENTS

| | | |
|---|---|---|
| KR | 10-1783953 | 10/2017 |
| KR | 10-2019-0090896 | 8/2019 |
| KR | 10-2020-0018749 | 2/2020 |
| KR | 10-2020-0102622 | 9/2020 |

* cited by examiner

ELECTRONIC APPARATUS

CROSS-REFERENCE TO RELATED APPLICATIONS

This application claims priority under 35 U.S.C. § 119 to Korean Patent Application No. 10-2021-0026201, filed on Feb. 26, 2021 in the Korean Intellectual Property Office, the disclosure of which is incorporated by reference in its entirety herein.

TECHNICAL FIELD

The present inventive concept relates to an electronic apparatus, and more particularly, to an electronic apparatus having increased manufacturing efficiency and reliability.

DISCUSSION OF RELATED ART

Typically, an electronic apparatus includes two or more electronic components. For example, an electronic apparatus such as a mobile phone, a notebook computer, or a television includes an electronic panel, a circuit board, or the like that generates an image.

The electronic panel and the circuit board are electrically connected to each other through connections of pads. In some embodiments, the two electronic components may be physically and electrically combined. For example, the two electronic components may be combined by means of a thermo-compression tool or the like, after a step for arranging a conductive adhesive member and the pads.

The electronic apparatus includes an inspection pad for determining whether the two electronic components are well connected. However, when a defective connection of the inspection pad is generated despite the presence of a stable electrical connection between the circuit board and the electronic panel, an error may occur indicating a defective connection between the circuit board and the electronic panel.

SUMMARY

The present inventive concept provides an electronic apparatus having an increased inspection reliability.

According to an embodiment of the present inventive concept, an electronic apparatus includes an electronic panel comprising a base substrate, a plurality of pixels on the base substrate, and a plurality of pads in an adhesive area. The plurality of pads are spaced apart from the plurality of pixels. A circuit board comprises a base film, and a plurality of leads disposed on the base film and overlapping the plurality of pads in a plan view. A conductive adhesive member is disposed on the adhesive area and is configured to electrically connect the circuit board and the electronic panel. The plurality of pads comprises a plurality of pixel pads electrically connected to the plurality of pixels, an arrangement pad spaced apart from the plurality of pixel pads, and a resistance measurement pad disposed between the arrangement pad and the plurality of pixels pads and insulated from the plurality of pixel pads. The plurality of leads comprises a plurality of pixel leads overlapping the plurality of pixel pads in the plan view, an arrangement lead overlapping the arrangement pad in the plan view, and a resistance measurement lead disposed between the plurality of pixel leads and the arrangement lead and insulated from the plurality of pixel leads. The resistance measurement lead comprises a plurality of resistance measurement leads disposed between the arrangement lead and the plurality of pixel leads and electrically connected to the resistance measurement pad, and a dummy lead spaced apart from each of the plurality of resistance measurement leads in the plan view.

In an embodiment, the resistance measurement lead may include first, second, and third leads arranged consecutively along a direction from the arrangement lead towards the pixel leads, and the third lead may be connected to a plurality of terminals.

In an embodiment, the dummy lead may be disposed between the first lead and the second lead.

In an embodiment, the dummy lead may be disposed between the first lead and the arrangement lead.

In an embodiment, the resistance measurement pad may include: a first pad connected with the first lead; a second pad connected with the second lead; and a third pad connected with the third lead. The first to third pads are connected with each other.

In an embodiment, the resistance measurement pad may further include a dummy pad disposed between the first pad and the second pad, and spaced apart from the first to third pads in the plan view. The dummy pad overlaps the dummy lead in the plan view.

In an embodiment, the dummy pad and the dummy lead may be connected with each other through the conductive adhesive member.

In an embodiment, a gap between the dummy pad and the dummy lead in a thickness direction of the electronic apparatus may be larger than a gap between the pixel lead and the pixel pad in the thickness direction of the electronic apparatus.

In an embodiment, the dummy lead may include a first dummy lead and a second dummy lead spaced apart from each other with the arrangement lead disposed therebetween.

In an embodiment, the first dummy lead includes a plurality of first dummy leads and the second dummy lead includes a plurality of second dummy leads. At least one of the plurality of first dummy leads has a shape that is different from a shape of another first dummy lead of the plurality of first dummy leads. At least one of the plurality of second dummy leads has a shape that is different from a shape of another second dummy lead of the plurality of second dummy leads.

In an embodiment, the plurality of leads may further include driving evaluation leads spaced apart from the arrangement lead and configured to receive an electrical signal, and the first dummy lead and the second dummy lead may be disposed in an area surrounded by the resistance measurement lead, the arrangement lead, and the driving evaluation leads.

According to an embodiment of the present inventive concept, an electronic apparatus includes an electronic panel comprising a base substrate, a plurality of pixels on the base substrate, and a plurality of pads in an adhesive area. The plurality of pads are spaced apart from the plurality of pixels. A circuit board comprises a base film, and a plurality of leads disposed on the base film and overlapping the plurality of pads in a plan view. A conductive adhesive member is disposed on the adhesive area and is configured to electrically connect the circuit board and the electronic panel. The plurality of pads includes pixel pads electrically connected to the pixels and the circuit board. An arrangement pad is electrically insulated from the pixel pads. Resistance measurement pads are insulated from the pixel pads, and are electrically connected to the circuit board. A dummy pad is disposed between the arrangement pad and the pixel pads and is spaced apart from the resistance measurement pads in the plan view.

In an embodiment, the resistance measurement pads may include first, second, and third pads arranged consecutively along a direction from the arrangement pad toward the pixel pads, and the dummy pad may be disposed between the first pad and the second pad.

In an embodiment, the first to third pads may be connected with each other, and the dummy pad may be spaced apart from the first to third pads.

In an embodiment, the dummy pad may be disposed between the first pad and the arrangement pad.

In an embodiment, the dummy pad may include: a first dummy pad disposed among the arrangement pad, the first pad, and the plurality of pixels; and a second dummy lead spaced apart from the first dummy pad with the arrangement pad disposed therebetween.

In an embodiment, the plurality of leads may include: first to third leads separately disposed from each other and respectively connected to the first to third pads; and a dummy lead overlapping the dummy pad in the plan view.

In an embodiment, the dummy lead may be connected with the dummy pad.

In an embodiment, at least one of the base film or the base substrate includes a deformation that is positioned in an area in which the dummy lead or the dummy pad is disposed, and the dummy lead may be electrically insulated from the dummy pad.

In an embodiment, the third lead may be connected to a plurality of terminals.

According to an embodiment of the present inventive concept, a combined electronic apparatus includes an electronic panel having a plurality of pixels in a display area and a plurality of pads in an adhesive area. A circuit board includes a plurality of leads that overlap the plurality of pads in a plan view. A conductive adhesive member is disposed on the adhesive area and is configured to combine and electrically connect the circuit board and the electronic panel to each other. A measurement connection pattern is formed by electrical connection of resistance measurement leads of the plurality of leads to resistance measurement pads of the plurality of pads. An arrangement pattern is formed by an arrangement pad of the plurality of pads and an arrangement lead of the plurality of leads. At least one dummy lead is disposed on the circuit board and at least one dummy pad is disposed on the electronic panel, the at least one dummy lead and the at least one dummy pad overlap each other in the plan view and are electrically insulated from the plurality of leads and the plurality of pads. The at least one dummy lead and the at least one dummy pad are disposed between the arrangement pattern and the measurement connection pattern to provide a predetermined minimum separation distance between the measurement connection pattern and the arrangement pattern.

In an embodiment, a dummy area is disposed adjacent to the arrangement pattern. The dummy area has an increased susceptibility to deformations when the circuit board and the electronic panel are combined via the conductive adhesive member. The at least one dummy lead and the at least one dummy pad are disposed in the dummy area.

BRIEF DESCRIPTION OF THE DRAWINGS

The accompanying drawings are included to provide a further understanding of the present inventive concept, and are incorporated in and constitute a part of this specification. The drawings illustrate embodiments of the present inventive concept and, together with the description, serve to explain principles of the present inventive concept. In the drawings.

DETAILED DESCRIPTION OF EMBODIMENTS

Figure 1:
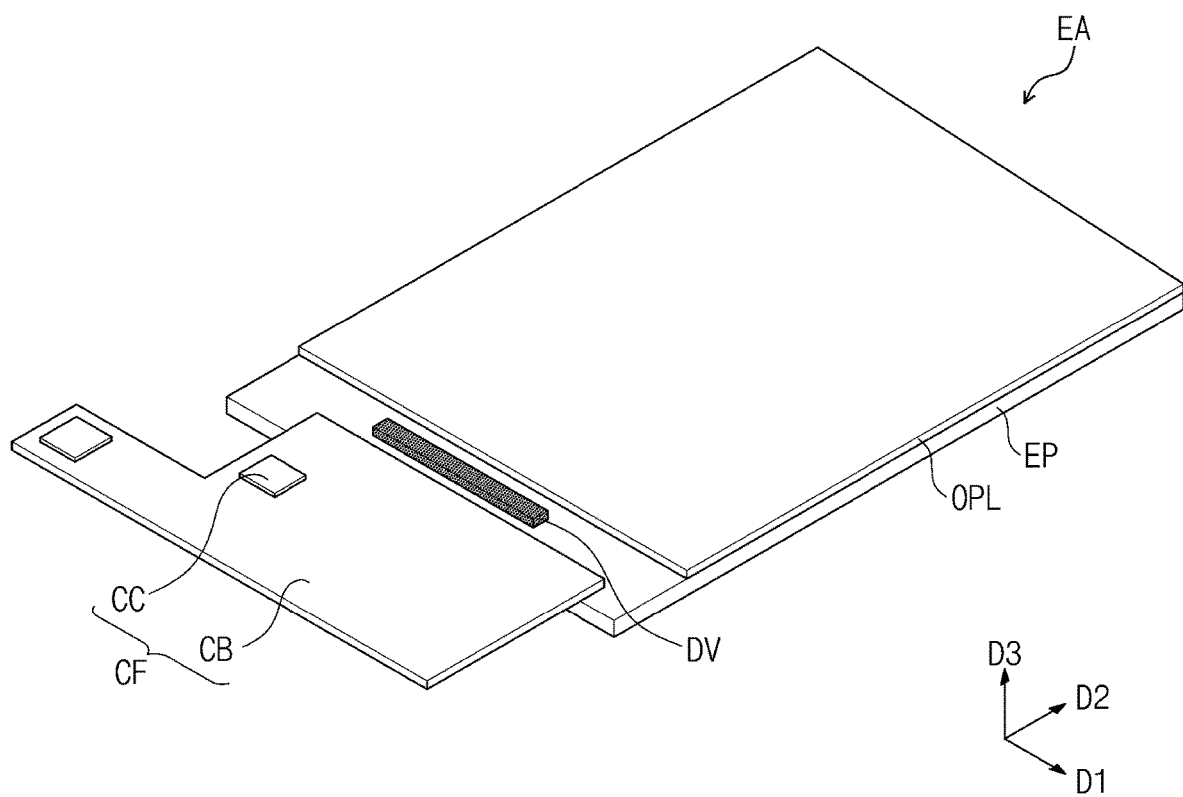
FIG. 1 is a perspective view of an electronic apparatus according to an embodiment of the present inventive concept.

It will be understood that when an element or layer is referred to as being "on", "connected to" or "coupled to" another element or layer, it can be directly on, connected or coupled to the other element or intervening third elements may be present. When an element or layer is referred to as being "directly on", "connected to" or "coupled to" another element or layer, no intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the present inventive concept. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative teams are intended to encompass different orientations of the device in use or operation in addition to the orientation depicted in the figures.

Unless otherwise defined, all terms (including technical and scientific terms) used herein have the same meaning as commonly understood by one of ordinary skill in the art to which embodiments of the present inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the present inventive concept will be described with reference to the accompanying drawings.

Figure 2A:
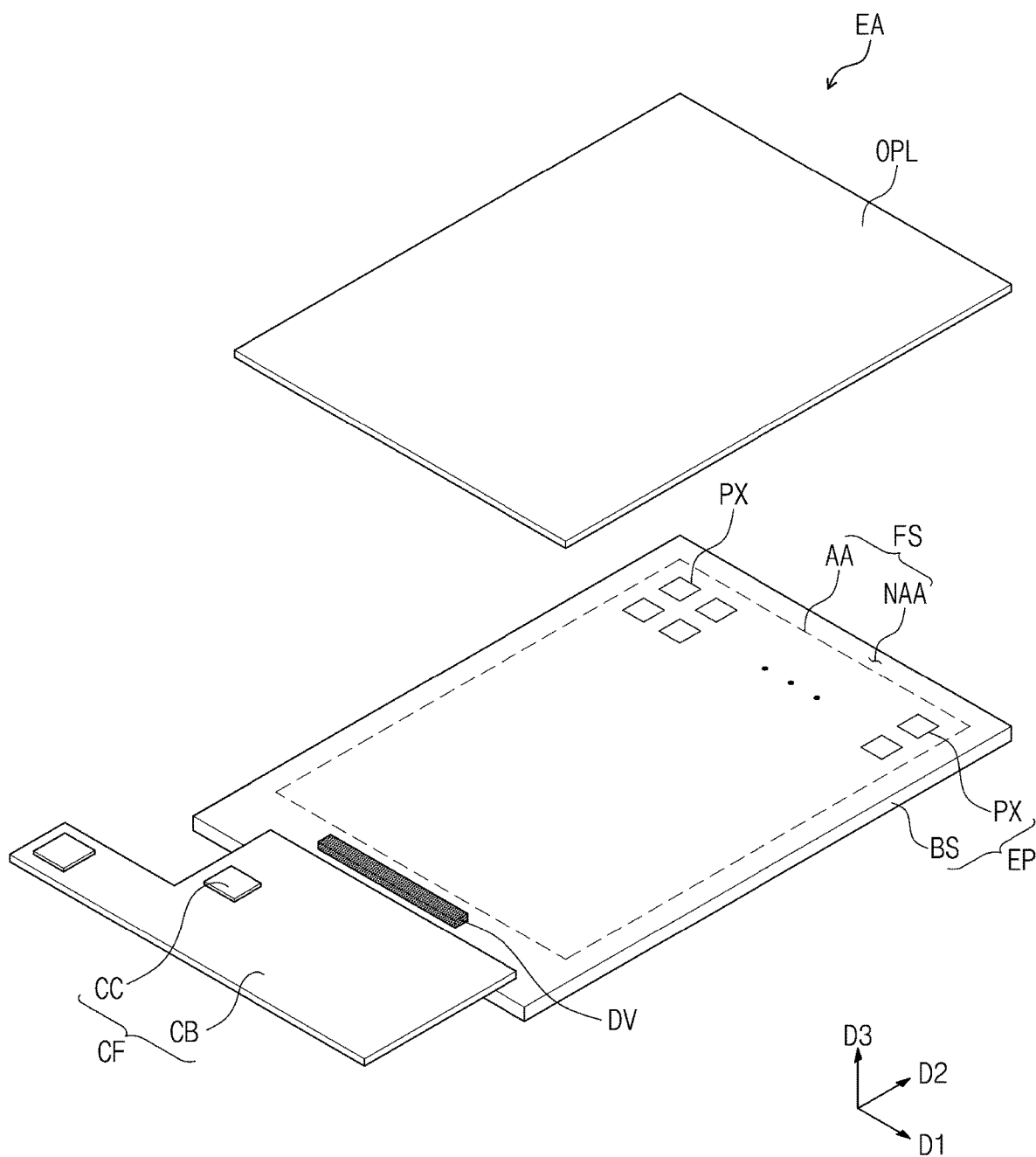
FIG. 2A is an exploded perspective view of the electronic apparatus shown in FIG. 1 according to an embodiment of the present inventive concept.
Figure 2B:
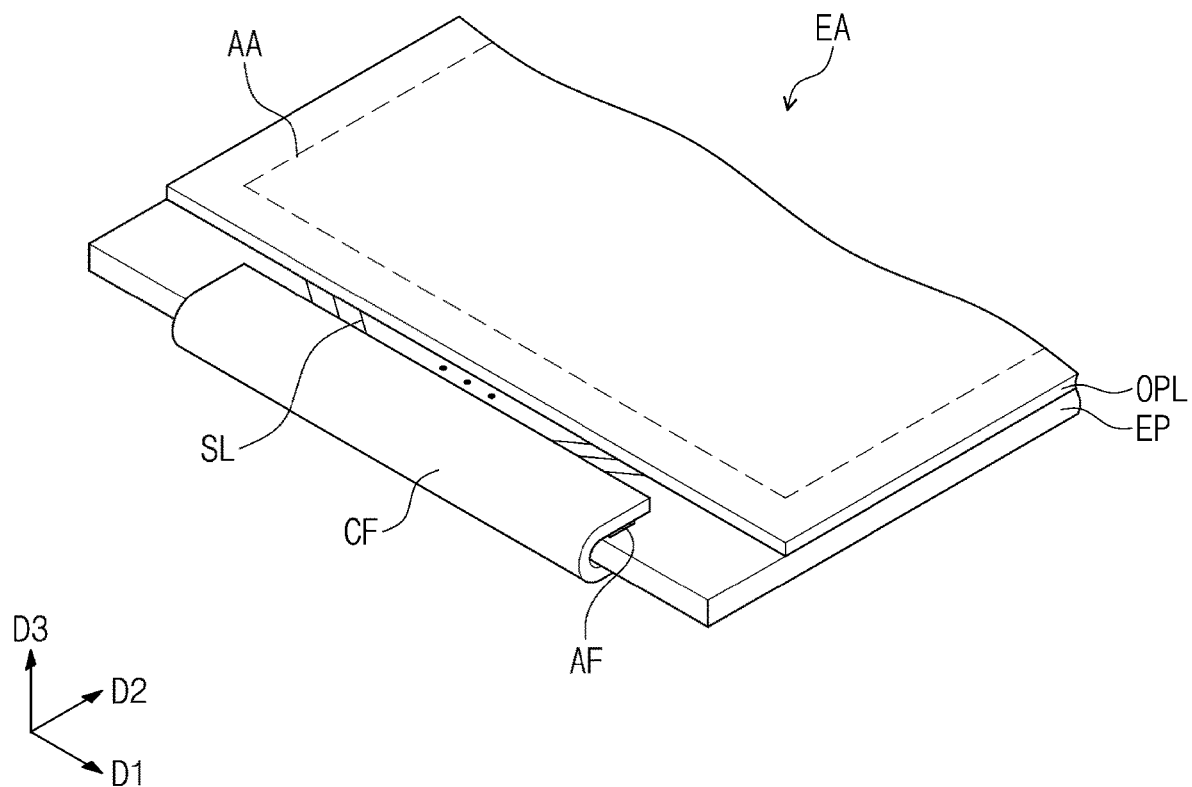
FIG. 2B is a perspective view illustrating a portion of the electronic apparatus shown in FIG. 1 according to an embodiment of the present inventive concept.

FIG. 1 is a perspective view of an electronic apparatus according to an embodiment of the present inventive concept. FIG. 2A is an exploded perspective view of the electronic apparatus shown in FIG. 1. FIG. 2B is a perspective view illustrating a portion of the electronic apparatus shown in FIG. 1. Hereinafter, embodiments of the present inventive concept will be described with reference to FIGS. 1 to 2B.

An electronic apparatus EA includes an electronic panel EP, a circuit board CF, a driving chip CC, a conductive adhesive member AF (FIG. 3A), and an optical member OPL. In an embodiment, the electronic panel EP displays an image on the front surface. The front surface may be defined in a first direction D1 and a second direction D2, and may be vertical to a third direction D3 which may be a thickness direction of the electronic apparatus EA. For example, the first direction D1, second direction D2 and third direction D3 may be perpendicular to each other. However, embodiments of the present inventive concept are not limited thereto and the first to third directions D1 to D3 may cross each other at various different angles. The front surface may be divided into an active area AA in which the image is displayed and a non-active area NAA adjacent to the active area AA. In an embodiment, the non-active area NAA may have a frame shape surrounding the edge of the active area AA. However, embodiments of the present inventive concept are not limited thereto, and the non-active area NAA may be defined to be adjacent to a portion of the edge of the display area AA in some embodiments.

In an embodiment, the electronic panel EP may sense an external input. For example, the electronic panel EP may include sensors disposed in the active area AA, and may sense the position or the strength of the external input applied to the active area AA. In an embodiment, the sensors may be driven in an electrostatic type, a pressure sensitive type, or in other various types. The external input may be provided in various types including a hand of a user, an electromagnetic pen, light, heat, and the like. However, embodiments of the present inventive concept are not limited thereto and the external input may vary. The electronic panel EP may sense the external input when the external input is proximate to or in direct contact with the electronic panel EP. However, in the present embodiment, an electronic panel on which an image is displayed will be described for convenience of explanation and not limitation.

Referring to FIG. 2A, the electronic panel EP may include a base substrate BS and a plurality of pixels PX. In an embodiment, each of the pixels PX may receive an electrical signal to display light forming the image. The pixels PX in FIG. 2A are illustrated to respectively correspond to light emission areas in which the light is displayed. Accordingly, the pixels PX are illustrated to be disposed in the active area AA and are spaced apart from each other (e.g., in the first and/or second directions D1, D2). However, embodiments of the present inventive concept are not limited thereto, and some among components configuring each of the pixels PX may be disposed in the non-active area NAA, disposed to be superimposed with components of an adjacent pixel in a plan view, etc.

Each of the pixels PX may include at least one transistor or a display element. In an embodiment, the transistor may include various semiconductor materials such as an oxide semiconductor, a multi-crystal semiconductor, a single-crystal semiconductor and an amorphous semiconductor. The display element may be electrically connected to the transistor and driven by the transistor. In an embodiment, the display device may include a liquid crystal capacitor, an organic light emitting element, an inorganic light emitting element, an electrophoretic element, or an electric wetting element, and include various electric elements such as an OLED, or an ultra-small LED that may display light. However, embodiments of the present inventive concept are not limited thereto.

The circuit board CF is disposed at one side of the electronic panel EP and electrically connected thereto. For example, as shown in FIG. 2A, the circuit board CF may be disposed on a lower side of the electronic panel EP (e.g., in the second direction D2). However, embodiments of the present inventive concept are not limited thereto and the circuit board CF may be disposed in various different sides of the electronic panel EP. The circuit board CF may generate an electrical signal to provide the same to the electronic panel EP, and receive an electrical signal generated in and received from the electronic panel EP to process the same.

As shown in FIG. 2B, electrical signals generated in the circuit board CF may be provided to each of the pixels PX through signal lines SL of the electronic panel EP. The signal lines SL may be electrically connected to the pixels PX. In an embodiment in which the electronic panel EP senses an external input, some of the signal lines SL may be electrically connected to sensors. However, the circuit board CF according to an embodiment of the present inventive concept may include various embodiments which are electrically connected to the electronic panel EP, and is not limited to any one embodiment.

The circuit board CF may include a flexible film CB and the driving chip CC. In an embodiment, the flexible film CB may be directly attached to the electronic panel EP through a conductive adhesive member AF to electrically connect the circuit board CF to the electronic panel EP. The flexible film CB may have flexibility. Accordingly, the flexible film CB may be assembled in a curved state in which the flexible film CB is bent towards the rear surface of the electronic panel EP.

In an embodiment, the driving chip CC may be mounted on the flexible film CB in a chip-on-film manner. The driving chip CC may be electrically connected to the flexible film CB through circuit lines included in the flexible film CB. The flexible film CB may electrically connect the driving chip CC and the electronic panel EP, and the driving chip CC may generate an electrical signal to be provided to the electronic panel EP or process an electrical signal provided from the electronic panel EP.

In an embodiment, the driving chip CC may include a gate driving circuit configured to generate gate signals or a data driving circuit configured to generate data signals. However, embodiments of the present inventive concept are not limited thereto, and the driving chip CC may include various control circuits configured to generate and process various kinds of control signals for driving the electronic panel EP.

The conductive adhesive member AF is disposed between the circuit board CF and the electronic panel EP to combine them. The conductive adhesive member AF may have both electrical conductivity and adhesiveness for attaching the circuit board CF to the electronic panel EP. Accordingly, the conductive adhesive member AF may physically and electrically combine the circuit board CF and the electronic panel EP. In an embodiment, the conductive adhesive member AF may include an anisotropic conductive adhesive film (ACF). However, embodiments of the present inventive concept are not limited thereto.

The conductive adhesive member AF may extend along a direction intersecting with the signal lines SL. In an embodiment, the conductive adhesive member AF may be provided in a shape having a length extending along the first direction DR1. However, embodiments of the present inventive concept are not limited thereto. In an embodiment, a portion of the conductive adhesive member AF may protrude to the outer side of the flexible film CB. For example, the length in the first direction DR1 of the conductive adhesive member AF on the electronic panel EP may be greater than or equal to the width of the flexible film CB in the first direction DR1. Accordingly, the ends of the conductive adhesive member AF may be aligned with a corner of the flexible film CB, or a portion of the conductive adhesive member AF may be exposed from the flexible film CB.

The driving circuit DV may be electrically connected to the electronic panel EP, in particular, to the pixels PX. For example, the driving circuit DV may include a data driving circuit configured to provide data signals to the pixels PX. However, embodiments of the present inventive concept are not limited thereto and the driving circuit DV may include various driving circuits such as a gate driving circuit, a light emitting control circuit, a power generation circuit, or the like, that provide electrical signals to the pixels PX.

In an embodiment, the driving circuit DV may be mounted on the electronic panel EP in a chip-on-panel manner. However, embodiments of the present inventive concept are not limited thereto, and the driving circuit DV may be provided through the same process as the pixels PX, such as a low temperature silicon process, to configure the electronic panel EP. In addition, in an embodiment of the present inventive concept, the driving circuit DV may be disposed in a different area of the electronic apparatus EA other than the area between the active area AA and the circuit board CF, or may be omitted altogether.

The optical member OPL is disposed on the electronic panel EP. For example, a lower surface of the optical member OPL may be disposed directly on an upper surface of the electronic panel EP (e.g., in the third direction D3). The optical member OPL covers the active area AA. The optical member OPL may be optically transparent. Accordingly, an image IM displayed in the active area AA is transmitted through the optical member OPL. The image IM displayed by the electronic panel EP may be transmitted through the optical member OPL, and be displayed on the top surface of the optical member OPL to be easily viewed by a user.

The optical member OPL may further cover at least a portion of the non-active area NAA. The optical member OPL may lower the external light reflectance. For example, the optical member OPL may lower a ratio of external light incident on the front surface FS of the electronic panel EP, or lower the transmittance of reflective light when the external light incident through the optical member OPL is reflected and output from the components of the electronic panel EP. For example, in an embodiment, the optical member OPL may include at least one of a polarization film or a phase difference film. However, embodiments of the present inventive concept are not limited. For example, in an embodiment, the optical member OPL may include a color filter or a black matrix. In an embodiment, the optical member OPL may be attached to the front surface FS of the electronic panel EP by means of an adhesive member or the like, or directly formed on the front surface FS of the electronic panel EP.

Figure 3A:
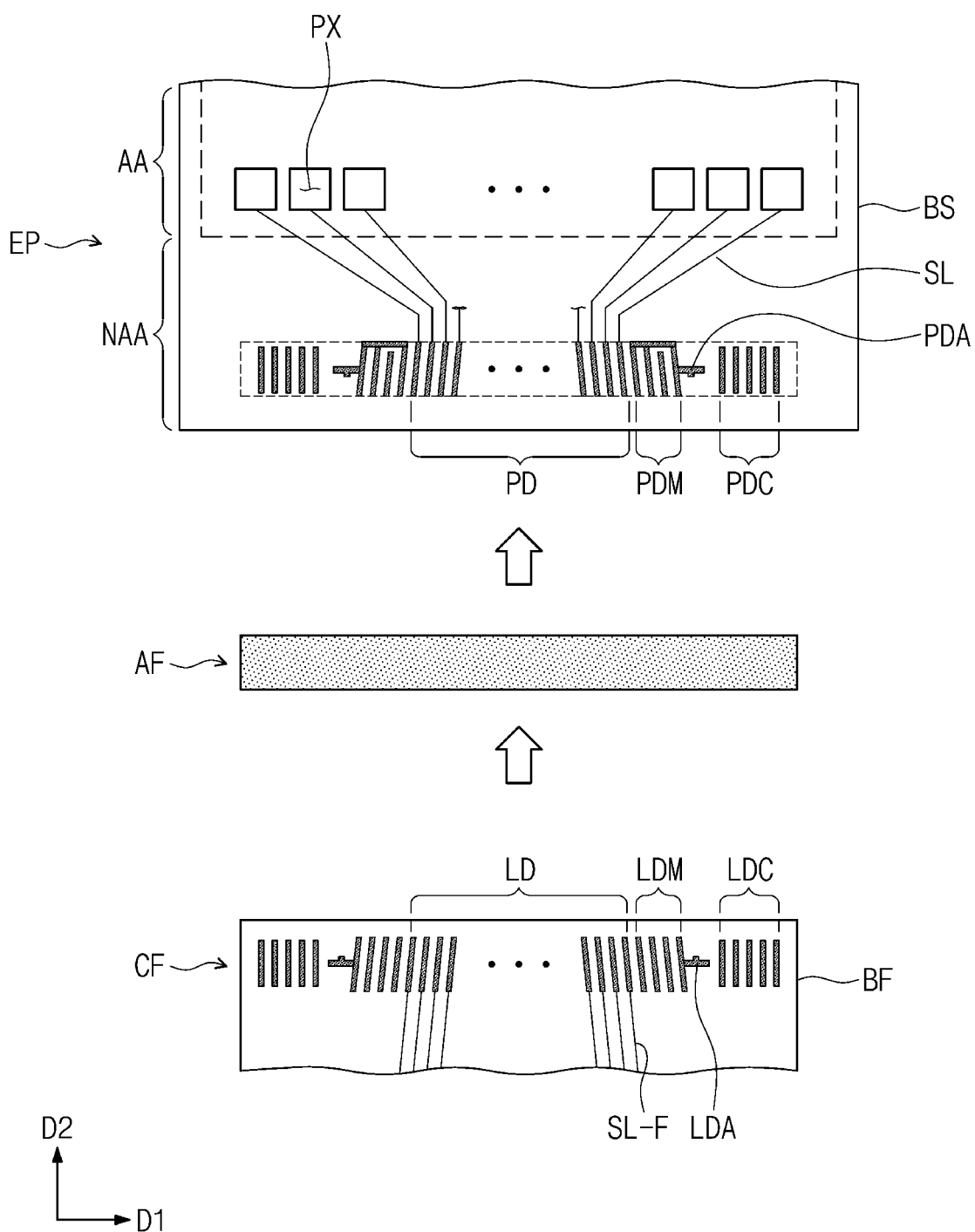
FIG. 3A is an exploded plan view of the electronic apparatus shown in FIG. 1 according to an embodiment of the present inventive concept.
Figure 3B:
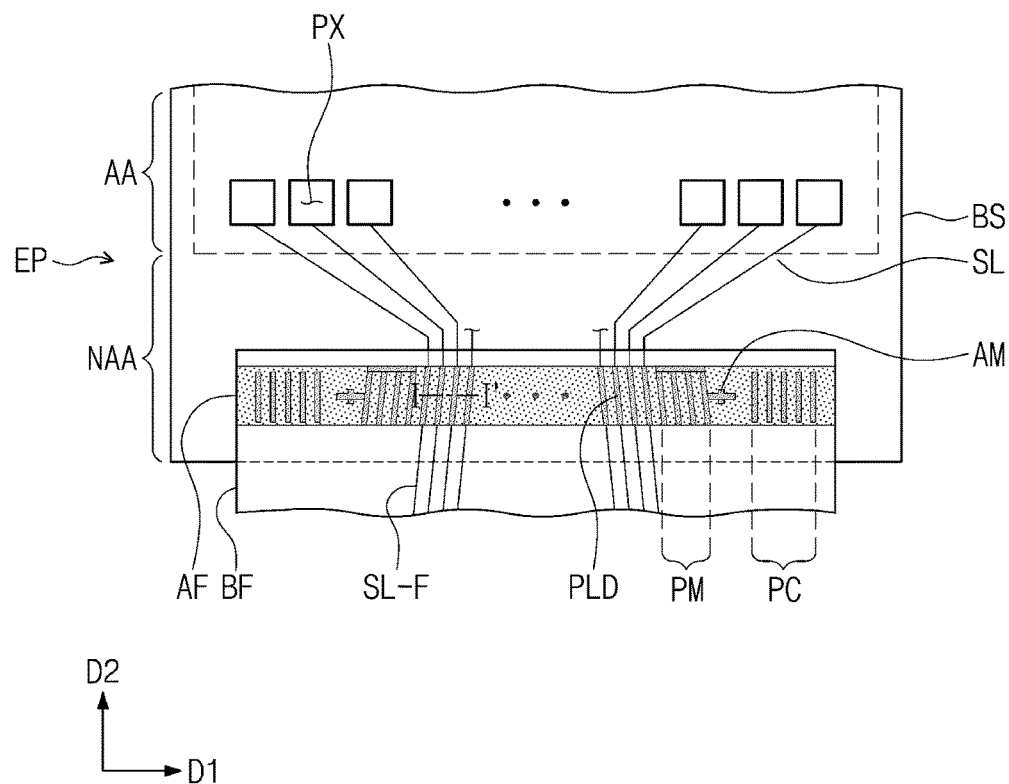
FIG. 3B is a plan view of the combined electronic apparatus shown in FIG. 3A according to an embodiment of the present inventive concept.
Figure 3C:
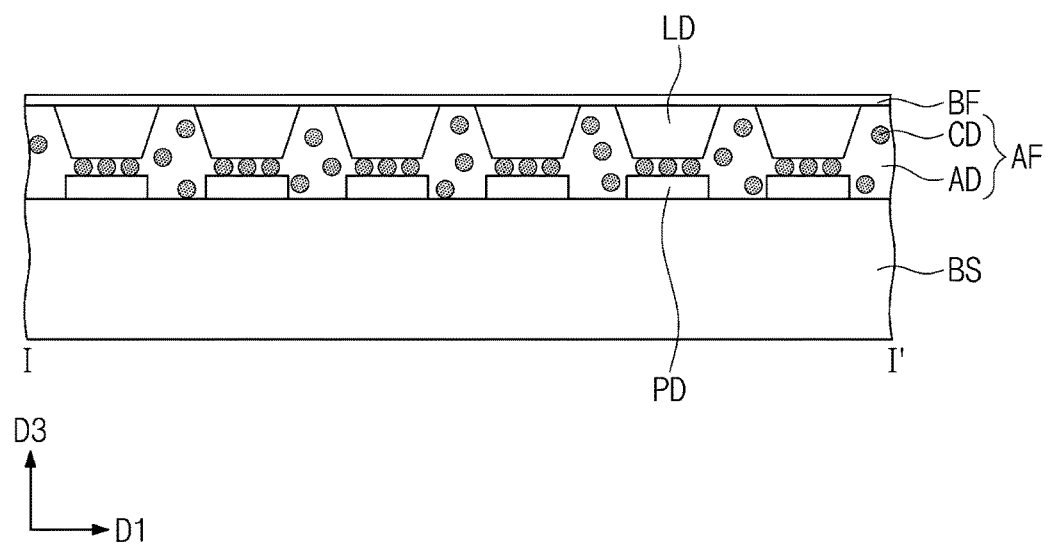
FIG. 3C is a cross-sectional view of the combined electronic apparatus taken along line I-I' of FIG. 3B.

FIG. 3C is an exploded plan view of the electronic apparatus shown in FIG. 1, and FIG. 3B is a combined plan view of the electronic apparatus shown in FIG. 3A. FIG. 3C is a cross-sectional view taken along line I-I' shown in FIG. 3B. Hereinafter, an embodiment of the present inventive concept will be described with reference to FIGS. 3A to 3C.

As shown in FIG. 3A, the electronic panel EP may include the base substrate BS, the pixels PX, the signal lines SL, a plurality of pixel pads PD, an arrangement pad PDA, a plurality of resistance measurement pads PDM, and a plurality of driving evaluation pads PDC. The base substrate BS includes the active area AA and the non-active area NAA, and is a base layer on which the pixels PX, the signal lines SL, the pixel pads PD, the arrangement pad PDA, the resistance measurement pads PDM, and the driving evaluation pads PDC are disposed. The base substrate BS may have an insulating property. In contrast, each of the pixel pads PD, the arrangement pad PDA, the resistance measurement pads PDM, and the driving evaluation pads PDC may have conductivity.

For convenience of explanation in the present embodiment, only a portion of the pixels PX, a portion of the signal lines SL, and a portion of the pixel pads PD may be illustrated. The signal lines SL may respectively connect the pixel pads PD and the pixels PX. Accordingly, the electrical signals received from the pixel pads PD may be delivered to each of the pixels PD through the signal lines SL. In an embodiment, the pixel pads PD may extend along a direction inclined against (e.g., between) the first direction D1 and the second direction D2. However, embodiments of the present inventive concept are not limited thereto. For example, the pixel pads PD may extend along a direction parallel to the second direction D2 or may be variously arranged.

As shown in the embodiment of FIG. 3A, the arrangement pad PDA may be disposed to be spaced from the pixel pads PD in the first direction D1. The arrangement pad PDA may be a reference for arrangement between the electronic panel EP and the circuit board CF together with an arrangement lead LDA when the electronic panel EP and the circuit board CF are combined by the adhesive member AF to be described later. The arrangement pad PDA is electrically insulated from the pixel pads PD.

The resistance measurement pad PDM is disposed between the pixel pads PD and the arrangement pad PDA (e.g., in the first direction D1). The resistance measurement pad PDM is spaced apart from the signal lines SL and the pixel pads PD on the plane (e.g., in a plane defined in the first and second directions D1, D2). In the embodiment shown in FIG. 3A, the resistance measurement pad PDM is illustrated to have a similar shape to the pixel pads PD and is directly connected to the arrangement pad PDA. However, embodiments of the present inventive concept are not limited thereto, and the resistance measurement pad PDM may have various different shapes and orientations. The resistance measurement pad PDM is electrically insulated from the pixel pads PD.

In an embodiment, the driving evaluation pads PDC may be electrically connected to at least some of the pixels PX through the signal lines SL. The driving evaluation pads PDC may be used for evaluating the electrical reliability of the electronic panel EP, and may receive independent signals from the pixel pads PD and the resistance measurement pad PDM. However, embodiments of the present inventive concept are not limited thereto, and the driving evaluation pads PDC may be omitted in the electronic panel EP in some embodiments. In an embodiment, the pixel pads PD, the resistance measurement pad PDM and the driving evaluation pads PDC may be disposed in an adhesive area ADA (FIG. 5A) of the electronic panel EP which may be positioned in the non-active area NAA of the base substrate BS.

The circuit board CF may include a base film BF, a plurality of lines SL-F, a plurality of pixel leads LD, an arrangement lead LDA, a plurality of resistance measurement leads LDM, and a plurality of driving evaluation leads LDC. In an embodiment, the base film BF may have flexibility and insulating properties. Accordingly, as described above, the flexible film CB may be curved in a combined state to the electronic panel EP.

The lines SL-F, the pixel leads LD, the arrangement lead LDA, the resistance measurement lead LDM, and the driving evaluation leads LDC are arranged on one surface of the base film BF. Each of the lines SL-F, the pixel leads LD, the arrangement lead. LDA, the resistance measurement lead LDM, and the driving evaluation leads LDC may be conductive. The resistance measurement lead LDM may be electrically insulated from the pixel leads LD.

The pixel leads LD are electrically connected with the pixel pads PD of the electronic panel EP. The pixel leads LD may be spaced apart from each other along the first direction D1 and provide independent electrical signals. In an embodiment, the pixel leads LD may extend along a direction inclined against (e.g., between) the first direction D1 and a second direction D2. However, embodiments of the present inventive concept are not limited thereto. The pixel leads LD may have a shape substantially corresponding to a shape of the pixel pads PD.

In an embodiment of the present inventive concept, thermal deformation may be generated in the base film BF of the circuit board CF or in the base substrate BS of the electronic panel EP due to heat or the like generated in a bonding process of the circuit board CF and the electronic panel EP. Accordingly, the pitch of the pixel pads PD or the pitch of the pixel leads LD may be deformed during the manufacturing process.

According to an embodiment of the present inventive concept, the pixel leads LD and the pixel pads PD are designed in a shape to extend along the inclined direction (e.g., between the first and second directions D1, D2), and thus even when the pitch of the pixel leads LD or the pixel pads PD is deformed, arrangement between the pixel pads PD and the pixel leads LD may be easily corrected through a positional movement of the circuit board CF in the second direction D2. However, embodiments of the present inventive concept are not limited thereto. For example, in an embodiment in which the pixel leads LD have a shape corresponding to the pixel pads PD, the pixel leads LD may be provided in a shape extending along a direction parallel to the second direction DR2.

The lines SL-F are disposed on one surface of the base film BF. First ends of the lines SL-F may be respectively connected to the pixel leads LD. The second ends of the lines SL-F that are opposite to the first ends may be electrically connected to the driving chip CC (see FIG. 1). Accordingly, the electrical signals processed in the driving circuit DV may be output to the pixel leads LD through the lines SL-F.

The arrangement lead LDA may be separated on the plane from the pixel leads LD. For example, the arrangement leads LDA may be arranged separately from the pixel leads LD and may be spaced apart therefrom in the first direction D1. In an embodiment of the present inventive concept, the arrangement between the circuit board CF and the electronic panel EP may be controlled by the degree of superposition between the arrangement pad PDA and the arrangement lead LDA. In an embodiment, the arrangement lead LDA is illustrated in a symmetric shape with the arrangement pad PDA on the basis of an axis extending along the first direction D1. However, embodiments of the present inventive concept are not limited thereto, and the arrangement lead LDA may be designed in various different shapes.

In an embodiment, the conductive adhesive member AF and the circuit board CF may be sequentially laminated on the pixel pads PD along the direction of the arrows shown in FIG. 3A. The conductive adhesive member AF is provided in an adhesive area ADA (FIG. 5A) of the electronic panel EP, and after the circuit board CF is disposed on the conductive adhesive member AF so that the arrangement pad PDA of the electronic panel EP and the arrangement lead LDA of the circuit hoard CF are a predetermined orientation, the electronic panel EP and the circuit board CF are compressed together and combined.

In an embodiment, the conductive adhesive member AF may extend along a direction intersecting with the signal lines SL. In an embodiment, the conductive adhesive member AF may be provided in a shape having a length longitudinally extending along the first direction D1. However, embodiments of the present inventive concept are not limited thereto. In an embodiment, a portion of the conductive adhesive member AF may protrude to the outer side of the flexible film CB. For example, the length in the first direction DR1 of the conductive adhesive member AF on the electronic panel EP may be greater than or equal to the width of the flexible film CB in the first direction DR1. Accordingly, the end of the conductive adhesive member AF may be aligned with a corner of the flexible film CB, or a portion of the conductive adhesive member AF may be exposed from the flexible film CB.

The driving circuit DV may be electrically connected to the electronic panel EP, such as to the pixels PX. For example, the driving circuit DV may include a data driving circuit configured to provide data signals to the pixels PX. However, embodiments of the present inventive concept are not limited thereto and the driving circuit DV may include various driving circuits such as a gate driving circuit, a light emitting control circuit, a power generation circuit, or the like, that provides electrical signals to the pixels PX.

The pixel pads PD and the pixel leads LD may be arranged to overlap each other in a plan view (e.g., in a third direction D3). The pads PD may be illustrated in the drawings as hatched so that the pixel pads PD and the pixel leads LD are easily distinguished. In FIG. 3B, the pixel pads PD and the respective corresponding pixel leads LD are combined and illustrated as one connection pattern PLD combined in parallel in a plan view.

According to an embodiment of the present inventive concept, the pixel leads LD may be designed to have a greater length than the pixel pads PD in the inclined direction. Accordingly, even when the circuit board CF moves in the second direction D2 with respect to the electronic panel EP within a process error, the circuit board CF and the electronic panel EP may be stably connected. However, embodiments of the present inventive concept are not limited thereto. For example, in some embodiments, the pixel leads PD may be designed to have a length substantially same as or less than a length of the pixel pads PD.

Referring to FIG. 3C, the pixel leads LD and the pixel pads PD may be connected by means of the conductive adhesive member AF. In an embodiment of the present inventive concept, the pixel pads PD are illustrated as disposed directly on one surface of the base substrate BS, and the pixel leads LD as disposed directly on one surface of the base film BF. However, embodiments of the present inventive concept are not limited thereto. For example, in an embodiment, at least one insulation layer may be further disposed between the pixel pads PD and the base substrate BS, and between the pixel leads LD and the base film BF.

In an embodiment, the conductive adhesive member AF has a length extending along the first direction D1 and a width extending along the second direction D2. In an embodiment, the length of the conductive adhesive member AF may be sized to cover the pixel pads PD, the arrangement pad PDA, the resistance measurement pad PDM, and the driving evaluation pads PDC. In addition, the width of the conductive adhesive member AF may be sized to cover at least a portion of the pixel pads PD. In an embodiment, the conductive adhesive member AF may entirely cover the pixel pads PD to increase the electrical connection reliability between the circuit board CF and the electronic panel EP.

The conductive adhesive member AF may include an adhesive layer AD and a plurality of conductive particles CD. The conductive particles CD may be dispersed inside the adhesive layer AD. The pixel leads LD may be respectively arranged to overlap the pixel pads PD (e.g., in the third direction D3). The pixel leads LD and the pixel pads PD may be physically combined (e.g., attached to each other) through the adhesive layer AD disposed therebetween (e.g., in the third direction D3). In addition, the pixel leads LD and the pixel pads PD may be electrically combined through the conductive particles disposed therebetween. In the present embodiment, the pixel leads LD and the pixel pads PD are illustrated as corresponding components that completely overlap on a cross section (e.g., in a third direction D3). However, embodiments of the present inventive concept are not limited thereto, and an area in which the leads and the pads do not partially overlap may be present, such as an error generated at the time of designing or an error during the manufacturing process, such as a vibration generated in the first direction D1 at the time of bonding.

Referring to FIG. 3B again, when the circuit board CF is connected with the electronic panel EP, the resistance measurement pads PDM and the resistance measurement leads LDM also overlap in a plan view (e.g., in the third direction D3). The resistance measurement pads PDM and the resistance measurement leads LDM may be electrically combined through the conductive adhesive member AF to make a measurement connection pattern PM. The evaluation of a connection failure between the circuit board CF and the electronic panel EP may be performed through resistance measurement of the measurement connection pattern PM. A detailed description thereabout will be provided later.

When the circuit board CF is connected with (e.g., combined with) the electronic panel EP, the driving evaluation pads PDC and the driving evaluation leads LDC also overlap in a plan view (e.g., in the third direction D3). The driving evaluation pads PDC and the driving evaluation leads LDC may be electrically combined through the conductive adhesive member AF to make an evaluation connection pattern PC. In an embodiment, the driving evaluation pads PDC may be electrically connected with the pixels PX or the driving circuit DV (see FIG. 1), and the driving evaluation leads LDC may be electrically connected with the circuit board CF. According to an embodiment of the present inventive concept, driving performance of the electronic panel EP may be analyzed through the driving evaluation pads PDC before the circuit board CF is connected with the electronic panel EP, and through the evaluation connection pattern PC after the circuit board CF is connected with the electronic panel EP. However, embodiments of the present inventive concept are not limited thereto, and the evaluation connection pattern PC may be omitted in some embodiments.

Figure 4A:
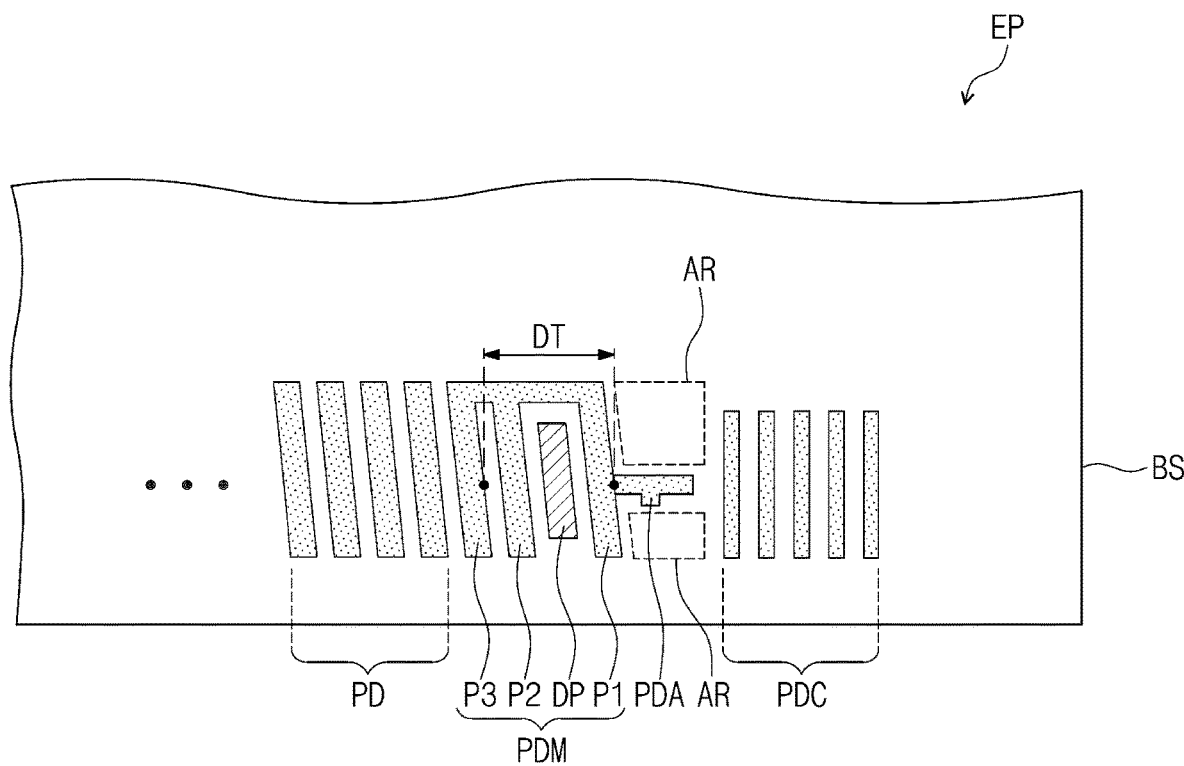
FIG. 4A is a plan view illustrating a portion of an electronic panel according to an embodiment of the present inventive concept.
Figure 4B:
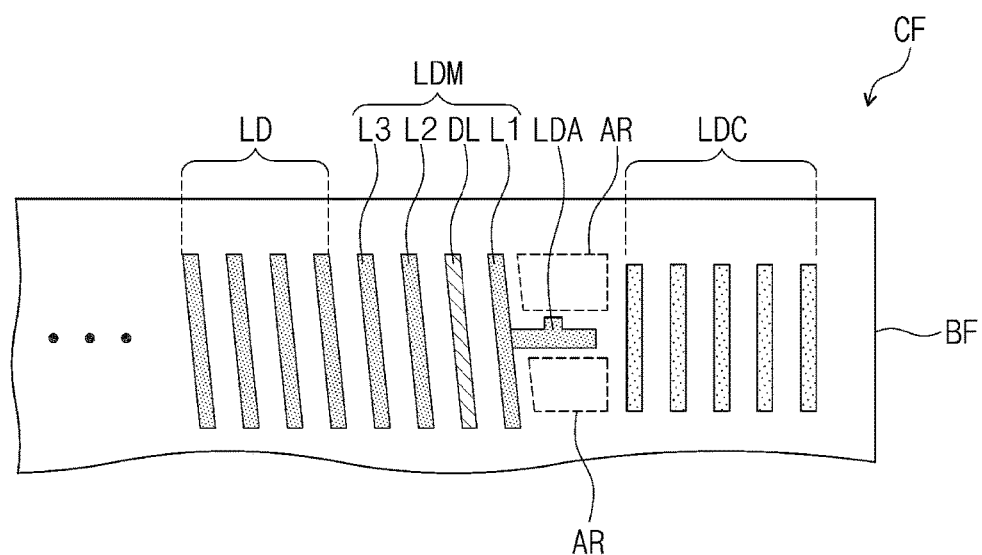
FIG. 4B is a plan view of a portion of a circuit board according to an embodiment of the present inventive concept.
Figure 4C:
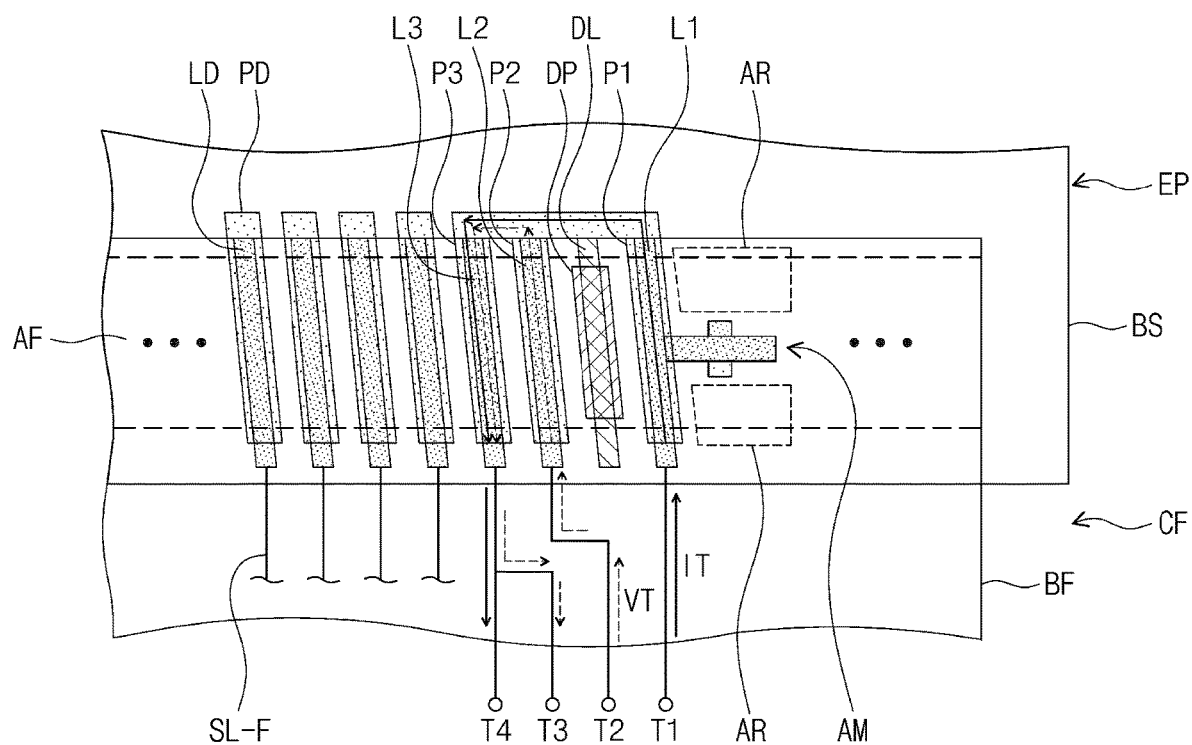
FIG. 4C is a plan view of the combined electronic panel shown in FIG. 4A and the circuit board shown in FIG. 4B according to an embodiment of the present inventive concept.

FIG. 4A is a plan view illustrating a portion of an electronic panel according to an embodiment of the present inventive concept. FIG. 4B is a plan view of a portion of a circuit board according to an embodiment of the present inventive concept. FIG. 4C is a combined plan view of the electronic panel shown in FIG. 4A and the circuit board shown in FIG. 4B. FIGS. 5A to 5D are perspective views illustrating a method for manufacturing an electronic apparatus according to embodiments of the present inventive concept. FIGS. 5A to 5D illustrate a combination process of the electronic panel EP and the circuit board CF.

For convenience of explanation, the resistance measurement pads PDM (see FIG. 4A), the arrangement pad PDA, and the driving evaluation pads PDC (see FIG. 4A) are omitted in FIGS. 5A to 5D. Hereinafter, an embodiment of the present inventive concept will be described with reference to FIGS. 4A to 5D. The same reference numbers are given to the same components as those described in FIGS. 1 to 3C, and repetitive description of identical or similar elements may be omitted.

Referring to FIG. 4A, the resistance measurement pad PDM may include a plurality of pads and a dummy pad DP. The plurality of resistance measurement pads may include a first pad P1, a second pad P2, and a third pad P3 arranged consecutively along a direction away from the arrangement pad PDA. However, embodiments of the present inventive concept are not limited thereto and the number of the plurality of pads of the resistance measurement pad PDM may vary. In an embodiment, the first pad P1 may directly contact the arrangement pad PDA, and the third pad P3 among the resistance measurement pads may be disposed at a position that is most adjacent to the pixel pads PD.

In an embodiment, the first to third pads P1, P2, P3 of the resistance measurement pads PDM may be connected with each other and may have an integrated shape, such as a general comb shape. In an embodiment, the first to third pads P1, P2, and P3 of the resistance measurement pads PDM may be connected and electrically energized with each other through a connection unit that intersects with each of the first to third pads P1, P2, and P3 of the resistance measurement pads PDM.

The dummy pad DP is spaced apart from the first to third pads P1, P2, and P3 of the resistance measurement pads. In the embodiment of FIG. 4A, the dummy pad DP is illustrated as disposed between the first pad P1 and the second pad P2 among the resistance measurement pads PDM. However, embodiments of the present inventive concept are not limited thereto and the positioning of the dummy pad DP may vary. In an embodiment, before combined with the circuit board CF, the dummy pad DP may have a pattern electrically floated from the first to third pads P1, P2, P3 of the resistance measurement pads PDM.

For convenience of description, the dummy pad DP is described as a component of the resistance measurement pad PDM. However, the structure of embodiments of the present inventive concept are not limited thereby. For example, the dummy pad DP may be described as a component distinguished from the resistance measurement pad PDM and disposed at a corresponding position.

In an embodiment, the third pad P3 is disposed separately from (e.g., spaced apart from) the arrangement pad PDA by a predetermined minimum separation distance. For example, when the width of each of the resistance measurement pads P1, P2, and P3 is about 0.060 mm and a pitch (a separation distance between the second pad and the first pad) is 0.040 mm, the minimum separation distance DT between the third pad P3 and the arrangement pad PDA is about 0.300 mm or greater. In an embodiment, the minimum separation distance DT may be a distance in a straight line parallel to the first direction D1 (see FIG. 3A). In the embodiment shown in FIG. 4A, the minimum separation distance is illustrated as the distance between one point on the right side of the third pad P3 and one point on the left side of the arrangement pad PDA that is spaced apart front the third pad P3 in the first direction D1 and is substantially co-planar to the third pad P3 in the second and third directions D2, D3. However, embodiments of the present inventive concept are not limited thereto and the minimum separation distance DT may be measured from various different points on the arrangement pad PDA and the third pad P3.

The driving evaluation pads PDC are disposed separately from the arrangement pad PDA or the resistance measurement pad PDM in a plan view. The driving evaluation pads PDC are arranged separately from each other in one direction (e.g., the first direction D1). In the embodiment shown in FIG. 4A, the driving evaluation pads PDC are illustrated to have a different shape from the pixel pads PD. For example, the driving evaluation pads PDC extend substantially in the second direction D2 whereas the pixel pads PD have an inclined orientation. However, embodiments of the present inventive concept are not limited thereto, and the driving evaluation pads PDC may have the same shape as the pixel pads PD in some embodiments.

Referring to FIG. 4B, the resistance measurement lead LDM may include a plurality of resistance measurement leads, and a dummy lead DL. The plurality of resistance measurement leads may include a first lead L1, a second lead L2, and a third lead L3 arranged consecutively along a direction away from the arrangement lead LDA. However, embodiments of the present inventive concept are not limited thereto and the number of the plurality of leads of the resistance measurement lead LDM may vary. The first lead L1 may directly contact the arrangement lead LDA, and the third lead L3 among the resistance measurement leads may be disposed at a position that is most adjacent to the pixel leads LD.

The resistance measurement leads, such as the first to third leads L1, L2, and L3, and the dummy lead DL are spaced apart from each other. The dummy lead DL is illustrated as disposed between the first lead L1 and the second lead L2 among the resistance measurement leads. However, embodiments of the present inventive concept are not limited thereto and the arrangement of the dummy lead DL may vary. For example, in an embodiment, the dummy lead DL may be disposed between the first lead L1 and the arrangement lead LDA. Before combined with the electronic panel EP, each of the dummy lead and the resistance measurement leads L1, L2, and L3 may have an electrically floated pattern.

Figure 5A:
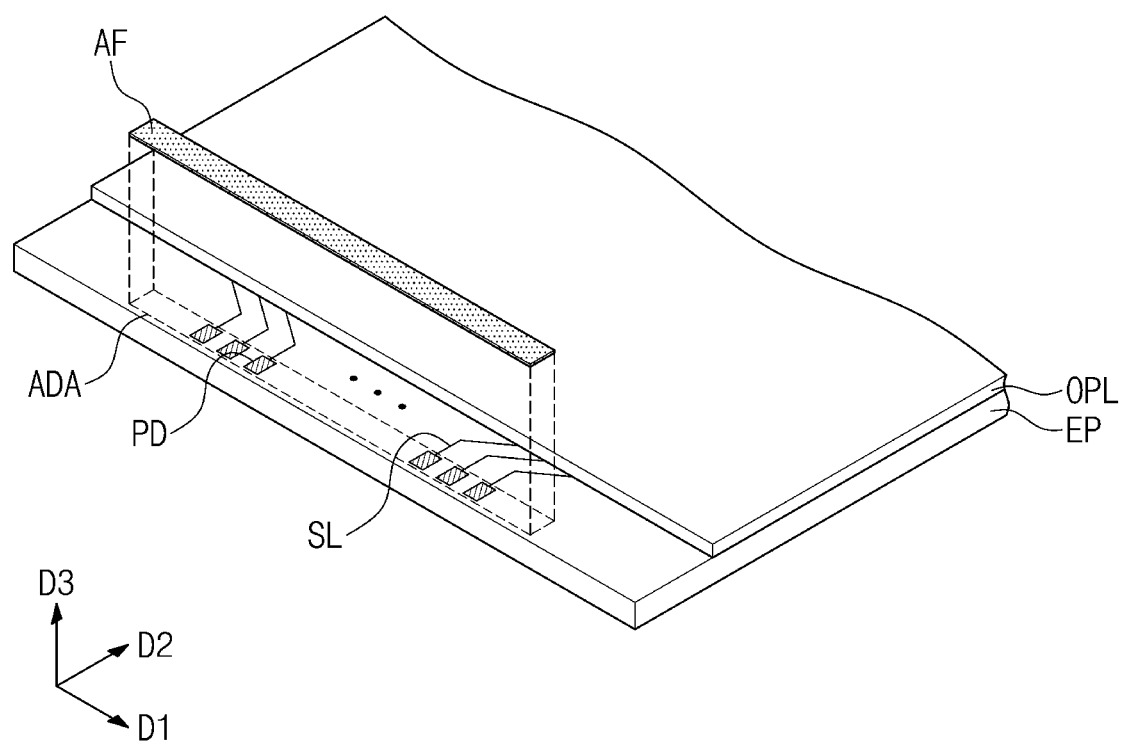
FIGS. 5A to 5D are perspective views illustrating a method for manufacturing an electronic apparatus according to embodiments of the present inventive concept.
Figure 5B:
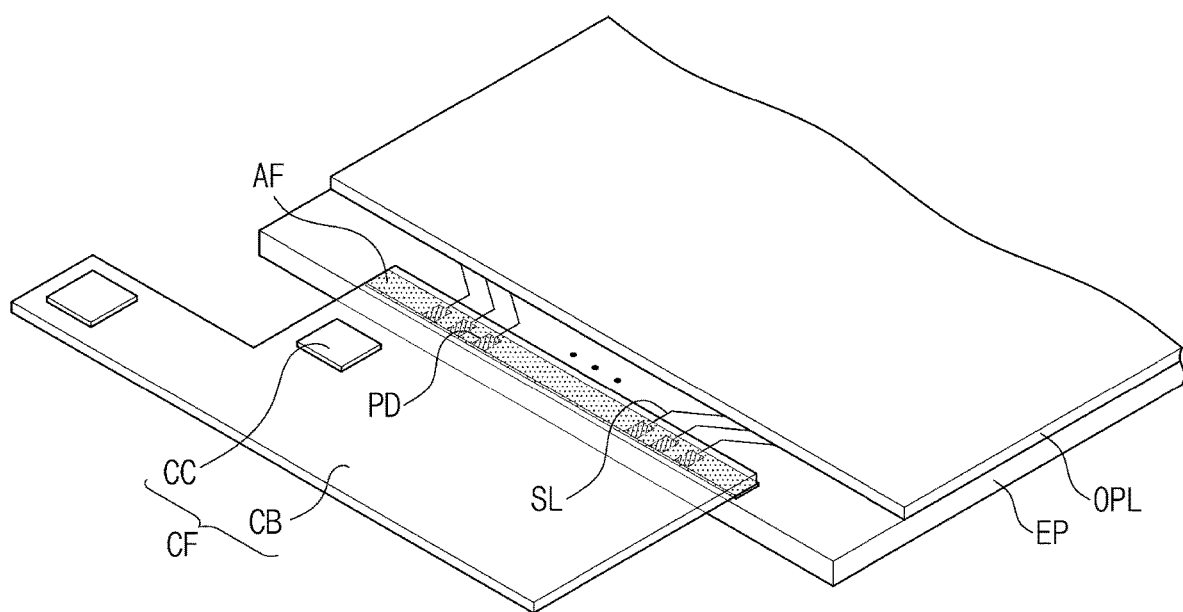

As shown in FIGS. 5A and 5B, the conductive adhesive member AF and the circuit board CF are sequentially disposed on the electronic panel EP. The conductive adhesive member AF is disposed in the adhesive area ADA of the electronic panel EP, and the circuit board CF is arranged to overlap the conductive adhesive member AF in a plan view (e.g., in a third direction D3). The circuit board CD may be arranged so that the pixel leads LD overlap the pixel pads PD in a plan view (e.g., in the third direction D3).

Referring to FIG. 4C, the electronic panel EP and the circuit board CF may be arranged by means of the orientation of the arrangement pad PDA with the arrangement lead LDA. In an embodiment, the circuit board CF and the electronic panel EP are arranged by orienting the circuit board CF and the electronic panel EP to have a shape similar to a plus sign '+'. Here, the pixel pads PD and the pixel leads LD are arranged to overlap in a plan view (e.g., in the third direction D3), and the resistance measurement pad PDM and the resistance measurement lead LDM are arranged to overlap in a plan view (e.g., in the third direction D3).

Figure 5C:
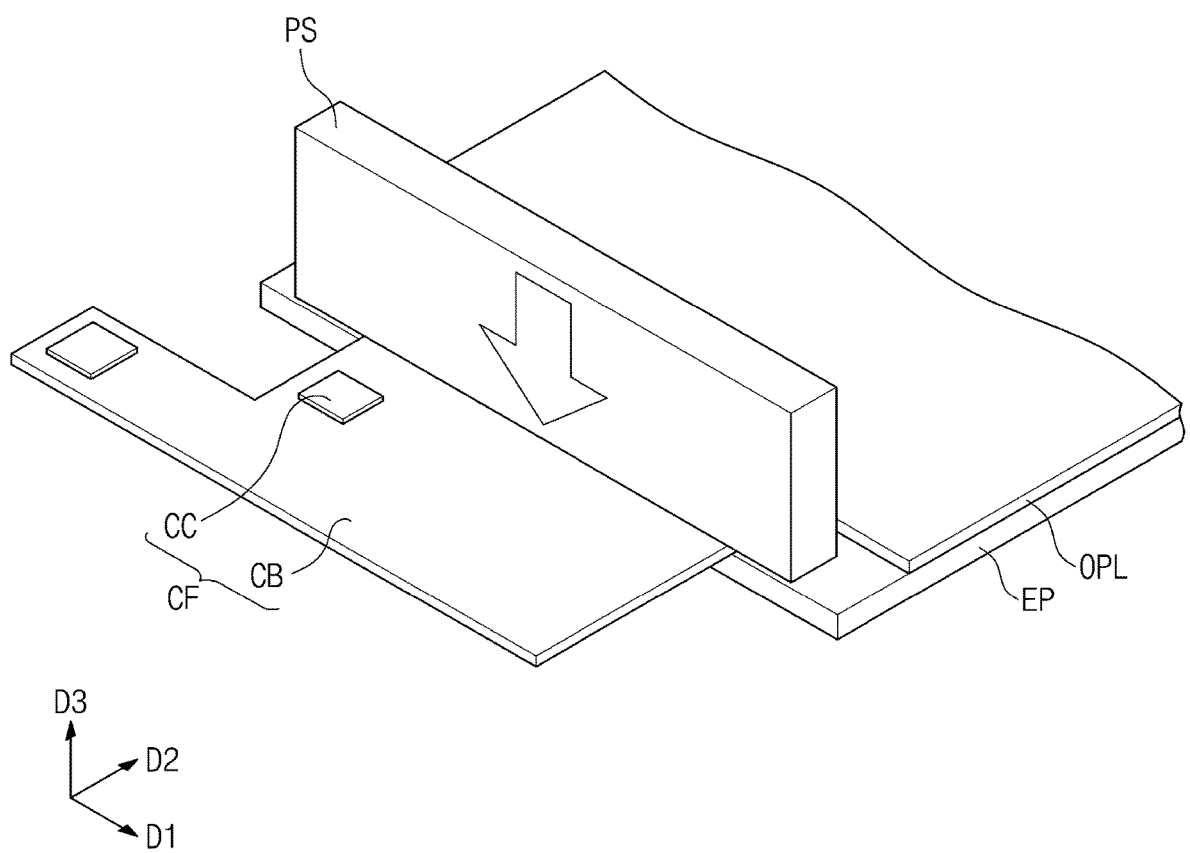
Figure 5D:
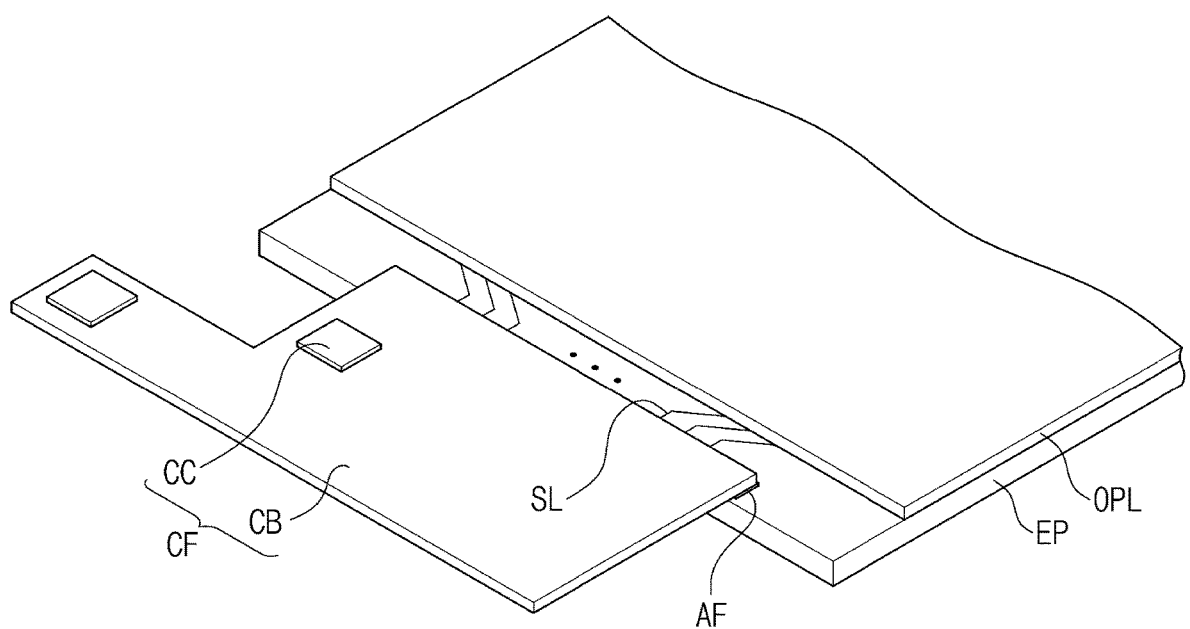
Figure 5D:
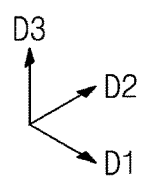

Thereafter, as shown in FIGS. 5C and 5D, the adhesive area ADA is compressed by means of a bonding machine PS to combine the circuit board CF and the electronic panel EP. In an embodiment, the bonding machine PS may be various devices known in the art which may apply pressure to the adhesive area ADA along the arrow direction. In addition, in an embodiment, the bonding machine PS may apply heat to the adhesive area ADA. Accordingly, the conductive particles CD (see FIG. 3C) dispersed in the conductive adhesive member AF electrically connect the pixel pads PD and the pixel leads LD, and electrically connect the resistance measurement pad PDM and the resistance measurement lead LDM. The adhesive layer AD of the conductive adhesive member AF physically combines the circuit board CF and the electronic panel EP.

FIG. 4C may correspond to a plan view in a state in which the circuit board CF is combined with the electronic panel EP. Referring to the resistance measurement pad PDM and the resistance measurement lead LDM, the first to third pads P1, P2, and P3 of the resistance measurement pad PDM respectively correspond to and are combined with the first to third leads L1, L2, and L3 of the resistance measurement lead LDM. The dummy pad DP of the resistance measurement pad PDM overlaps the dummy lead DL of the resistance measurement lead LDM (e.g., in the third direction D3). The dummy pad DP and the dummy lead DL may or may not be electrically connected with each other based on the degree of connection of the circuit board CF and the electronic panel EP.

In the embodiment shown in FIG. 4C, terminals for inspecting connection failure between the resistance measurement pad PDM and the resistance measurement lead LDM may be provided to the base film BF of the circuit board CF. For example, the resistance measurement lead LDM may be connected to first to fourth terminals T1, T2, T3, and T4. In an embodiment, the first lead L1 is connected to the first terminal T1, and the second lead L2 is connected to the second terminal T2. The third lead L3 is branched into two lines to be connected to the third and fourth terminals T3 and T4.

FIG. 4C briefly illustrates a contact resistance measurement arrangement for measuring connection failure. An inspection current IT is applied to the first terminal T1 and an inspection voltage VT is applied to the second terminal T2. When the inspection current IT is applied through the first terminal T1, the inspection current IT flows to a part at which the third lead L3 and the third pad P3 are connected via a part at which the first lead L1 and the first pad P1 are connected, and the inspection current IT is then output toward the fourth terminal T4. For example, the inspection current IT has a flow that moves along the first terminal T1, the first lead L1/the first pad P1, the third lead L3/the third pad P3, and the fourth terminal T4.

A current flow may be generated along a dotted line arrow by the inspection voltage VT applied to the second terminal T2. The current generated by the inspection voltage VT has a flow that is output through the third terminal T3 via the second terminal T2, the second lead L2/the second pad P2, and the third lead L3/the third pad P3.

According to an embodiment of the present inventive concept, a connection resistance between the resistance measurement pad PDM and the resistance measurement lead LDM may be measured through the current measured at the third terminal T3 and the voltage measured at the fourth terminal T4. In an embodiment in which the connection resistance is equal to or less than a predetermined value, the connection resistance indicates that the connection between the circuit board CF and the electronic panel EP is stable. In embodiments in which the connection resistance is greater than the predetermined value, the connection resistance may indicate that there is connection failure therebetween.

However, embodiments of the present inventive concept are not limited thereto and the connection failure between the circuit board CF and the electronic panel EP may be measured in various other ways. For example, the connection failure may be determined by measuring loop resistance of the resistance measurement lead LDM by connecting the second lead L2 to two terminals and the third lead L3 to one terminal.

Among the resistance measurement pads PDM according to an embodiment of the present inventive concept, the third pad P3, with which the third terminal T3 and the fourth terminal T4 are connected, may be disposed at a position that is spaced apart further from the arrangement pad PDA than from the dummy pad DP. In addition, among the resistance measurement lead LDM, the third lead L3, with which the third terminal T3 and the fourth terminal T4 are connected, may be disposed at a position that is spaced apart further from the arrangement lead LDA than from the dummy lead DL.

As described above, in an embodiment the minimum separation distance DT between the third pad P3 and the arrangement pad PDA may be about 0.300 mm or greater. The third lead L3 may be disposed at a position corresponding to the third pad P3. However, embodiments of the present inventive concept are not limited thereto. For example, in an embodiment in which the third pad P3 is separated by a distance that the third pad P3 is not influenced from the arrangement pad PDA, in particular, from a dummy area AR, the minimum separation distance DT between the third pad P3 and the arrangement pad PDA may be arranged in various ways.

The third pad P3 and the third lead L3 are spaced apart from the arrangement pad PDA and the arrangement lead LDA, respectively, by a predetermined minimum distance and are disposed at positions adjacent to the display pad PD or the display lead LD. Therefore, a connection failure that may be generated due to the arrangement pad PDA may be prevented from influencing the connection between the third pad P3 and the third lead L3. However, embodiments of the present inventive concept are not limited thereto. For example, in some embodiments, another pad other than the third pad P3 among the resistance measurement pad PDM is connected with the third terminal T3 and the fourth terminal T4 and a corresponding minimum separation distance DT may be the separation distance between the corresponding pad and the arrangement pad PDA. According to an embodiment of the present inventive concept, a pad for measuring the resistance is spaced apart from the arrangement pad PDA by a predetermined minimum distance, and the pad is not limited solely to the third pad P3.

In an embodiment of the present inventive concept, the inspection current IT or a current by the inspection voltage VT does not pass through the dummy pad DP and the dummy lead DL. For example, the dummy pad DP or the dummy lead DL, which does not influence the measurement of the connection resistance, is disposed in an area in which the connection failure may be generated. Therefore, an error may be prevented due to a partial connection failure generated in the resistance measurement pad PDM and the resistance measurement lead LDM which would erroneously indicate a connection failure between the pixel pad PD and the pixel lead LD.

A surrounding area AR (hereinafter, the dummy area) of the arrangement pad PDA and the arrangement lead LDA is illustrated as a dotted line on the plane on which the circuit board CF is connected with the electronic panel EP. The dummy area AR is the surrounding area adjacent to the arrangement pad PDA and the arrangement lead LDA, and may be an area spaced apart from the resistance measurement pad PDM, the resistance measurement lead LDM, the driving evaluation pad PDC, and the driving evaluation lead LDC. In the present embodiment, the dummy area AR is illustrated as an empty space. However, embodiments of the present inventive concept are not limited thereto. Additionally, the size and shape of the dummy area AR may vary and is not limited to those illustratively shown in FIG. 4C.

In an embodiment of the present inventive concept, when the circuit board CF is connected with the electronic panel EP, the adhesive layer AD of the conductive adhesive member AF or the conductive particles CD may further flow into the dummy area AR and thus the base film BF and/or the base substrate BS may be easily deformed. The connection failure between the third lead L3 and the third pad P3 may be prevented by further separating (e.g., spacing apart) the third lead L3 and the third pad P3 from the dummy area AR, with which the third terminal T3 and the fourth terminal T4 corresponding to connection resistance measurement terminals are connected. Accordingly, the connection failure between the resistance measurement pad PDM and the resistance measurement lead LDM may be prevented, and the inspection reliability may be increased in a connection process of the circuit board CF and the electronic panel EP.

Figure 6A:
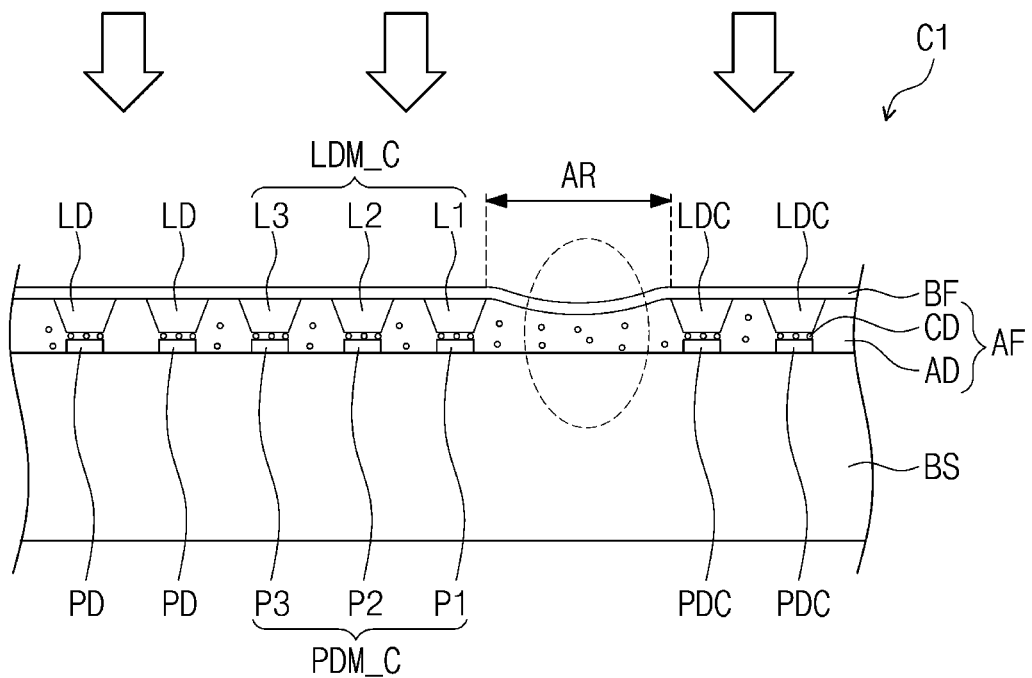
FIGS. 6A and 6B are cross-sectional views illustrating comparative embodiments.
Figure 6B:
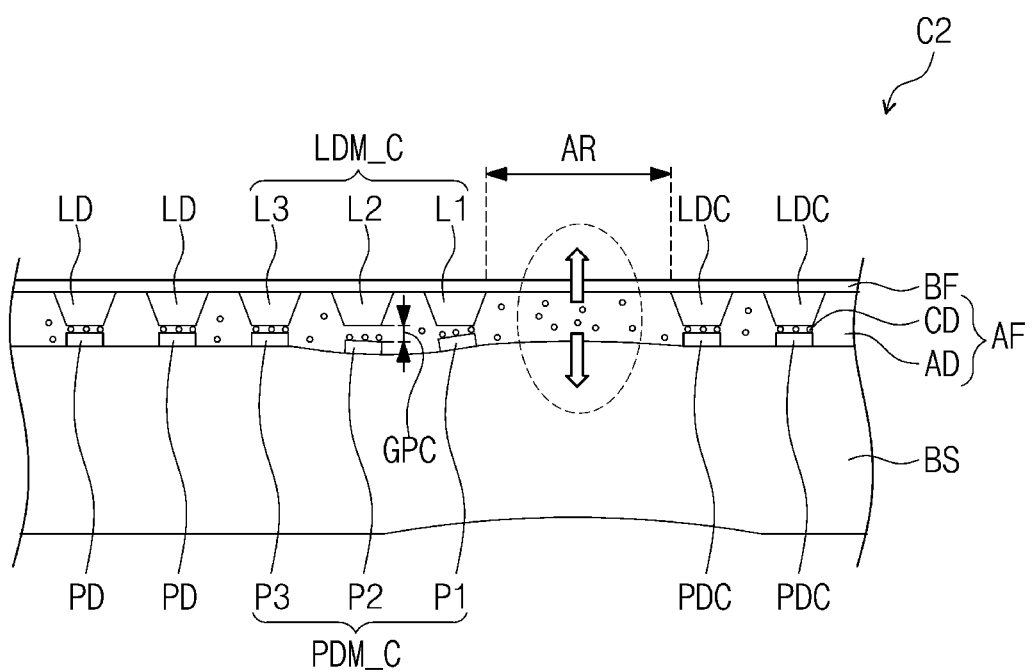
Figure 7A:
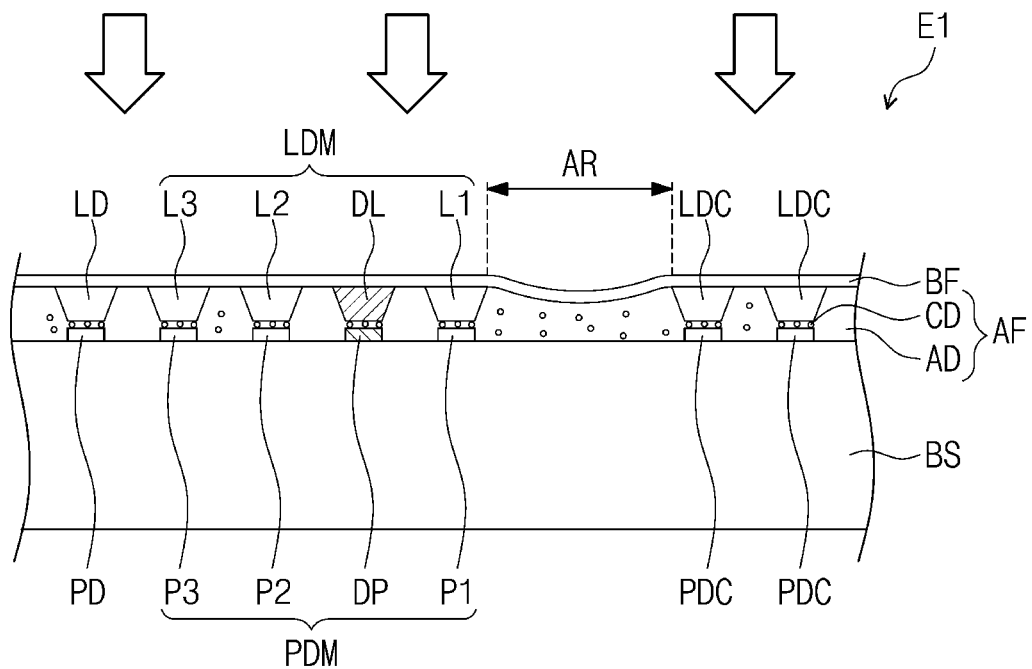
FIGS. 7A and 7B are cross-sectional views of embodiments of the present inventive concept.
Figure 7B:
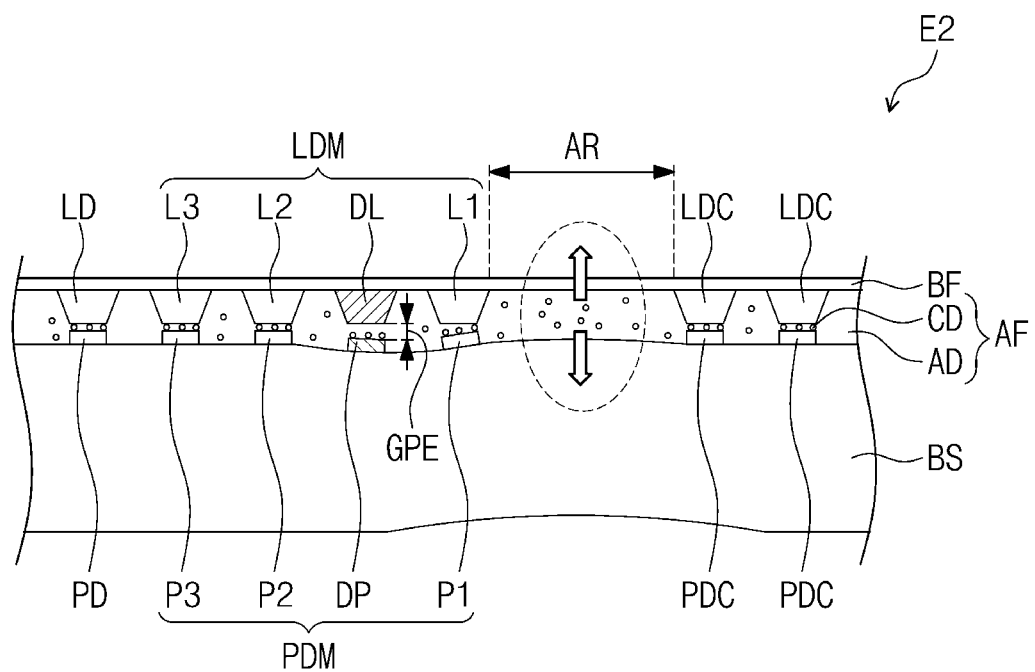

FIGS. 6A and 6B are cross-sectional views according to a comparative embodiment. FIGS. 7A and 7B are cross-sectional views of embodiments of the present inventive concept. Cross-sectional views of the resistance measurement pads and the resistance measurement leads are shown in FIGS. 6A to 7B. In addition, FIGS. 6A and 7A illustrate a step corresponding to FIG. 5C, and FIGS. 6B and 7B illustrate a step corresponding to FIG. 5D. Hereinafter, a comparative embodiment and embodiments of the present inventive concept will be described with reference to FIGS. 6A to 7B.

As shown in FIG. 6A, a comparative embodiment C1 includes a resistance measurement lead LDM_C configured to only include the first to third leads L1, L2, and L3, and a resistance measurement pad PDM_C configured to only include the first to third pads P1, P2, and P3. The resistance measurement lead LDM_C is arranged at a position corresponding to the resistance measurement pad PDM_C to be compressed by the bonding machine PS (see FIG. 5C). Accordingly, the resistance measurement pad PDM_C and the resistance measurement lead LDM_C are electrically energized through the conduction particles CD.

In this comparative embodiment, since a lead or pad is not disposed in the dummy area AR and only the adhesive layer AD and the conductive particles CD are provided, a deformation of the shape of the base film BF and/or the base substrate BS may be generated due to pressure. For example, in FIG. 6A, it is illustrated that a deformation in the shape of the base film BF is generated.

Thereafter, as shown in FIG. 6B, a comparative embodiment C2 may correspond to a state after a certain time has elapsed in the comparative embodiment C1 shown in FIG. 6A. The adhesive layer AD in the comparative embodiment C2 may be expanded as indicated by the arrow in a process where a fluid state is changed to a fixed state by heat and pressure after a certain time has elapsed. In this comparative embodiment, delamination may be generated between the pads or leads adjacent to the dummy area AR, such as between the resistance measurement pad PDM_C and the resistance measurement lead LDM_C. For example, the delamination phenomenon may frequently appear in an area in which the second lead L2 and the second pad P2 are disposed. Accordingly, in the comparative embodiment C2, the second lead L2 and the second pad P2 may have a gap GPC therebetween (e.g., in a thickness direction, such as the third direction D3) and the second lead L2 and the second pad P2 may not be electrically connected to each other. For example, since the gap GPC between the second lead L2 and the second pad P2 is larger than a gap between the pixel lead LD and the pixel pad PD, and is larger than the diameter of a conductive particle CP, the connection failure may be generated between the second lead L2 and the second pad P2.

In this comparative embodiment, an electrical connection for stably driving the electronic panel EP and the circuit board CF is substantially made between the pixel leads LD and the pixel pads PD. The resistance measurement lead LDM_C and the resistance measurement pad PDM_C correspond to components for determining the connection failure between the electronic panel EP and the circuit board CF. However, as shown in FIG. 6B, even when the pixel leads LD and the pixel pads PD are stably connected, the resistance measurement lead LDM_C and the resistance measurement pad PDM_C may indicate that there is an electrical connection failure between the circuit board CF and the electronic panel EP due to the connection failure between the resistance measurement lead LDM_C and the resistance measurement pad PDM_C.

In contrast, in an embodiment E1 of the present inventive concept as shown in FIG. 7A, the resistance measurement lead LDM includes the dummy lead DL, and the resistance measurement pad PDM may include the dummy pad DP. If the position of the dummy area AR is the same as in the comparative embodiment C1, the dummy lead DL and the dummy pad DP may be disposed at the positions at which the second lead L2 and the second pad P2 of the comparative embodiment C1 are disposed. Accordingly, the second lead L2 and the second pad P2 may be disposed further away from the dummy area AR in the embodiment E1 than in the comparative embodiment C1.

As shown in FIG. 7B, even in embodiments in which heat expansion is generated in the adhesive layer AD which results in the deformation of the shape of the base film BF and/or the base substrate BS, the dummy lead DL and the dummy pad DP are disposed at positions at which the largest deformation is generated and the resistance measurement pads P1, P2, and P3 and the resistance measurement leads L1, L2, and L3 are spaced apart from the position at which the largest deformation is generated. Therefore, a connection failure may be prevented from being generated between the first to third pads P1, P2, and P3 of the resistance measurement pads PDM and the first to third leads L1, L2, and L3 of the resistance measurement leads LDM.

For example, the gap GPE between the dummy lead DL and the dummy pad DP may be greater than or equal to the gap between the pixel pad PD and the pixel lead LD due to the deformation in the base film BF and/or the base substrate BS. However, even in embodiments in which the gap GPE between the dummy lead DL and the dummy pad DP (e.g., in a thickness direction of the electronic apparatus EA, such as the third direction D3) is larger than the diameter of the conduction particle CD, the first to third pads P1, P2, and P3 of the resistance measurement pads PDM or the first to third leads L1, L2, and L3 of the resistance measurement leads LDM are not electrically influenced. Accordingly, in embodiment E1, the circuit board CF and the electronic panel EP may not be measured to have a connection failure therebetween, and thus the process reliability may be increased. In addition, an electronic apparatus EA that is erroneously determined to be a failure may be prevented from being generated, thereby reducing process cost.

Figure 8A:
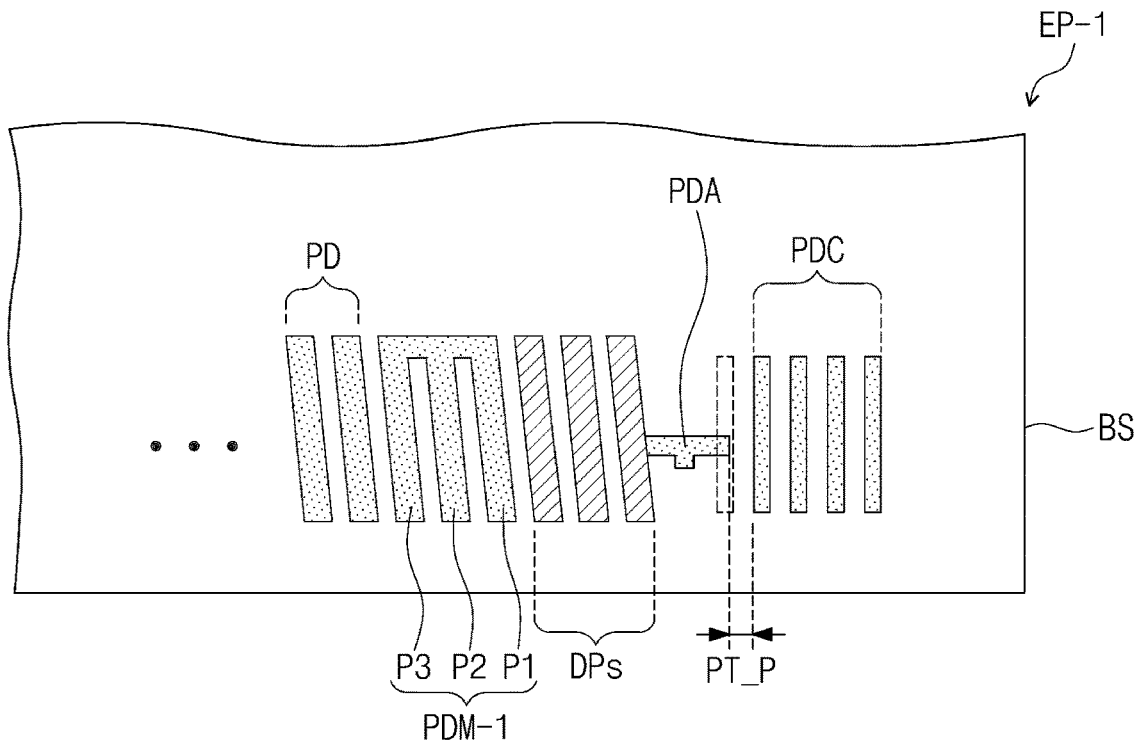
FIG. 8A is a plan view illustrating a portion of an electronic panel according to an embodiment of the present inventive concept.
Figure 8B:
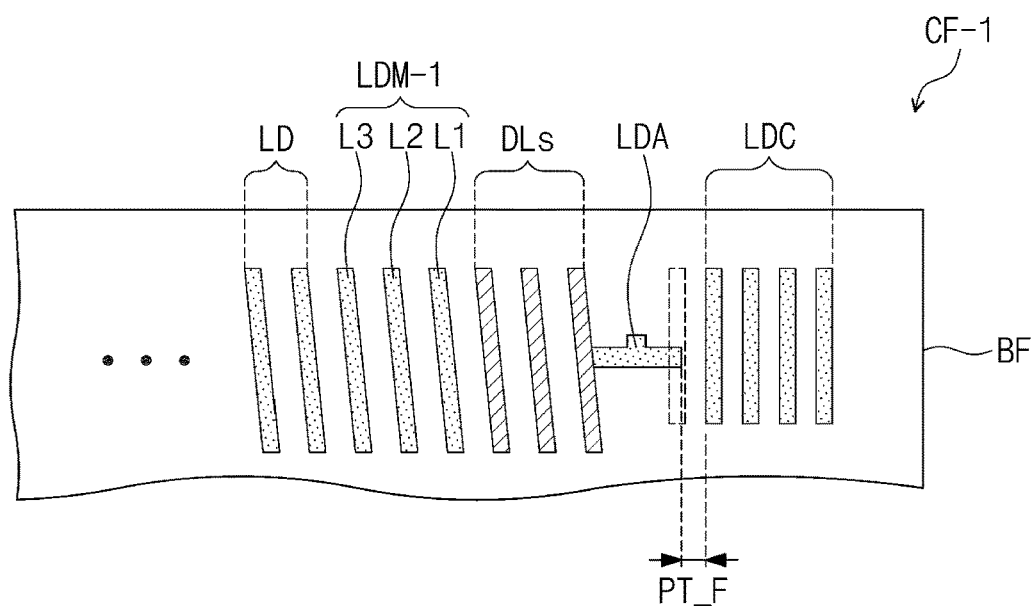
FIG. 8B is a plan view of a portion of a circuit board according to an embodiment of the present inventive concept.
Figure 9A:
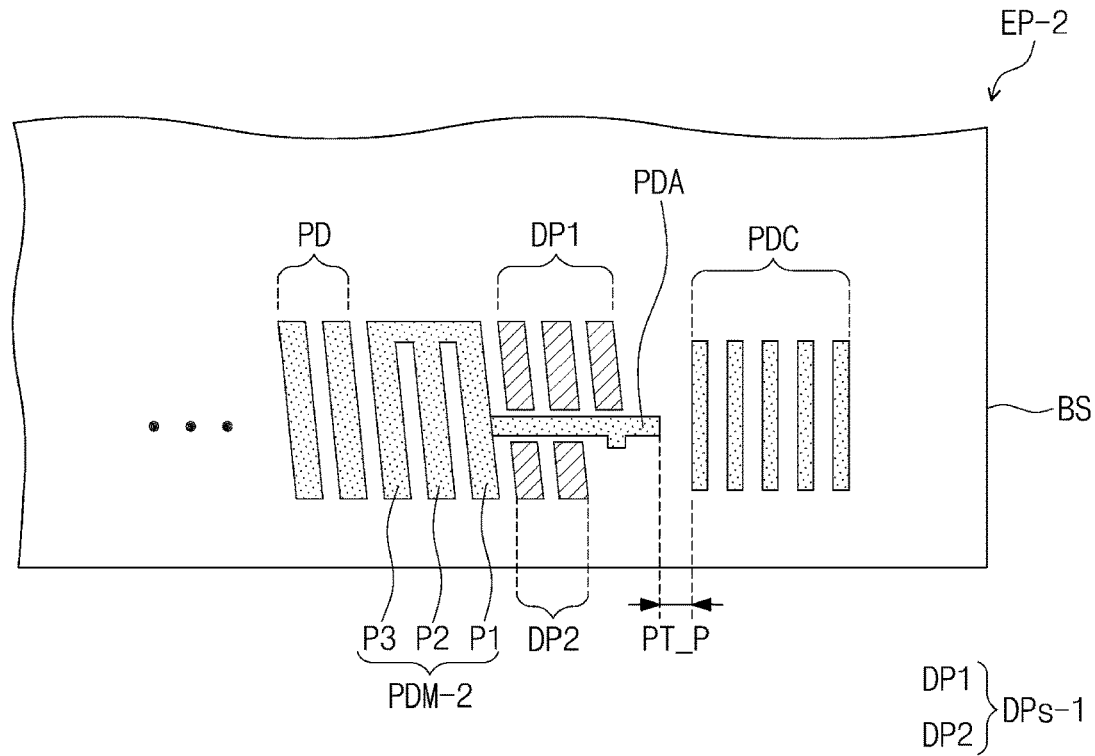
FIG. 9A is a plan view illustrating a portion of an electronic panel according to an embodiment of the present inventive concept.
Figure 9B:
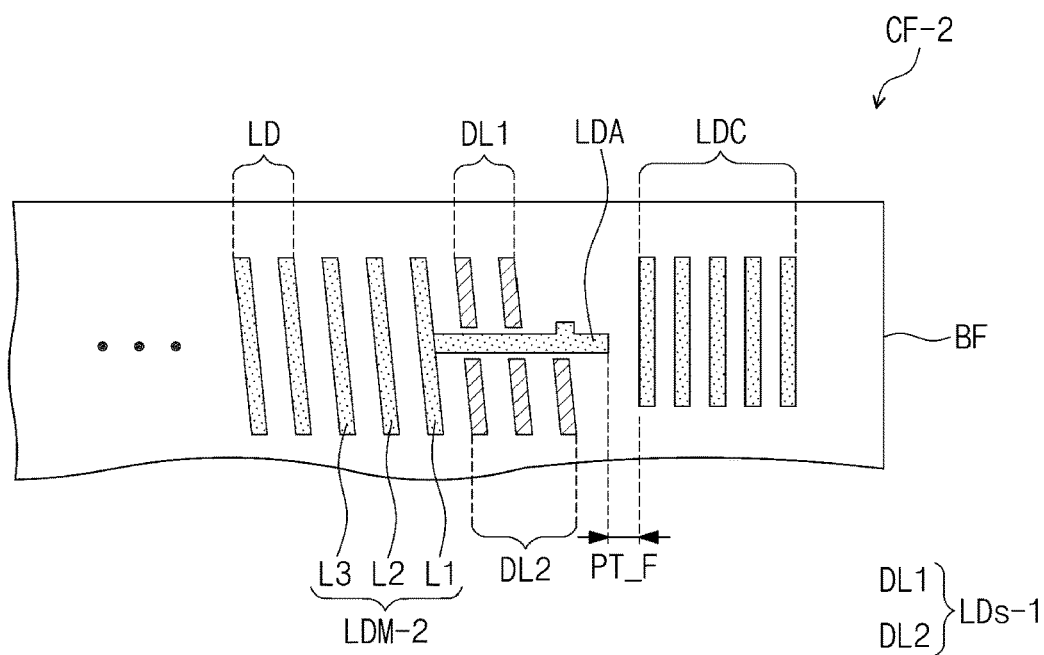
FIG. 9B is a plan view of a portion of a circuit board according to an embodiment of the present inventive concept.
Figure 10A:
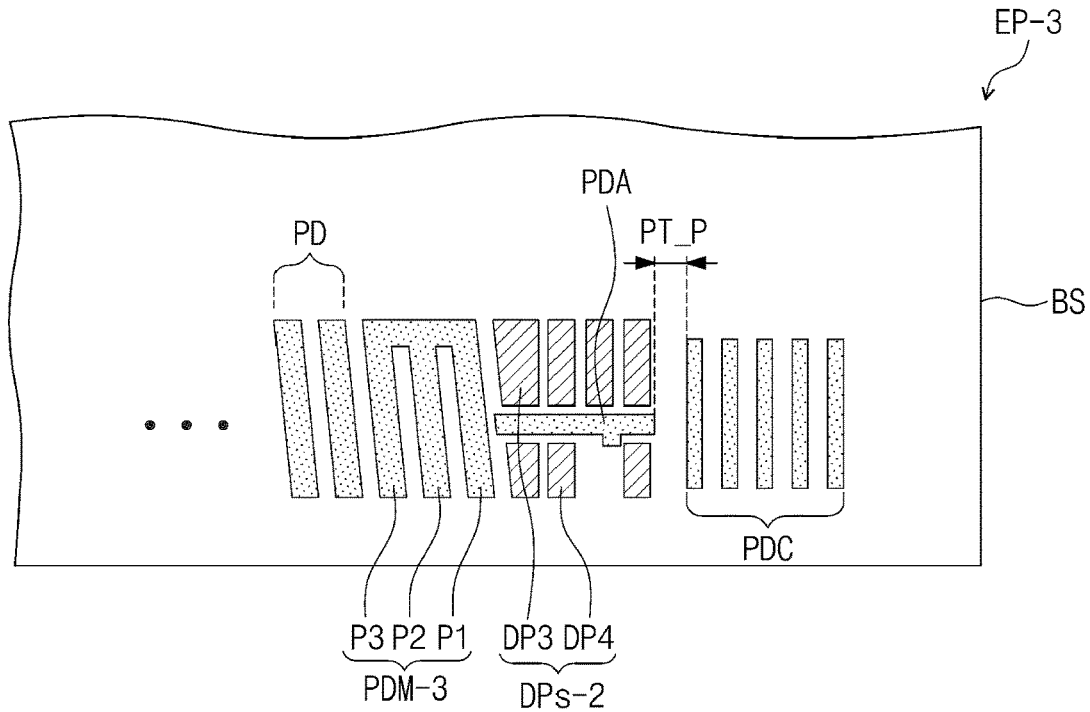
FIG. 10A is a plan view illustrating a portion of an electronic panel according to an embodiment of the present inventive concept.
Figure 10B:
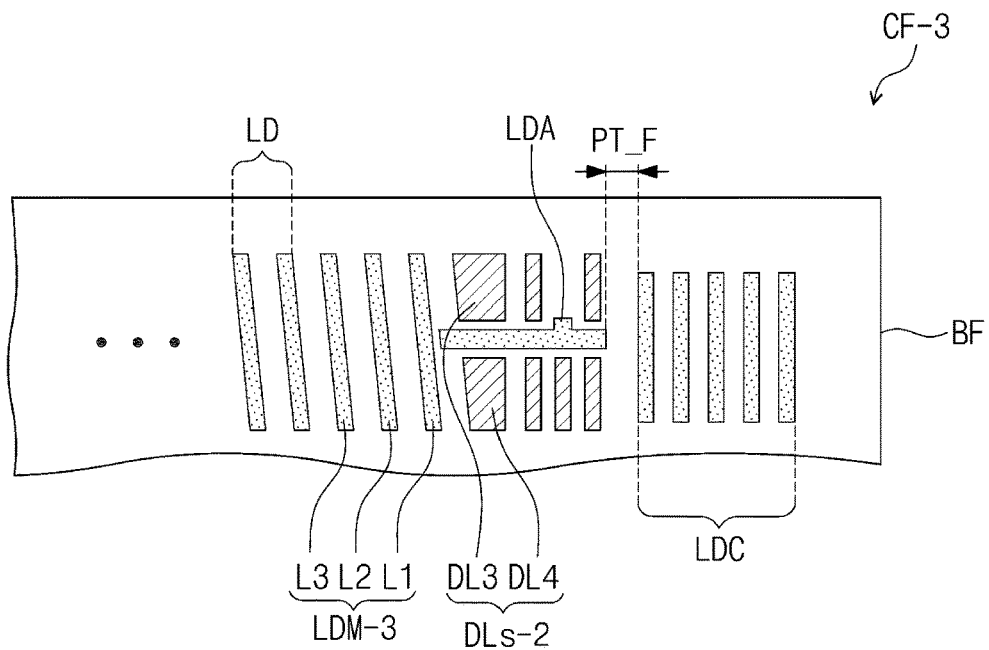
FIG. 10B is a plan view of a portion of a circuit board according to an embodiment of the present inventive concept.

FIG. 8A is a plan view illustrating a portion of an electronic panel according to an embodiment of the present inventive concept. FIG. 8B is a plan view of a portion of a circuit board according to an embodiment of the present inventive concept. FIG. 9A is a plan view illustrating a portion of an electronic panel according to an embodiment of the present inventive concept. FIG. 9B is a plan view of a portion of a circuit board according to an embodiment of the present inventive concept. FIG. 10A is a plan view illustrating a portion of an electronic panel according to an embodiment of the present inventive concept. FIG. 10B is a plan view of a portion of a circuit board according to an embodiment of the present inventive concept.

FIGS. 8A, 9A, and 10A illustrate an area corresponding to FIG. 4A, and FIGS. 8B, 9B, and 10B illustrate an area corresponding to FIG. 4B. Hereinafter, an embodiment of the present inventive concept will be described with reference to FIGS. 8A to 10B. The same reference numbers are given to the same or similar components as those described in FIGS. 1 to 7B, and repetitive descriptions may be omitted for convenience of explanation.

As shown in FIG. 8A, an electronic panel EP-1 may include a plurality of dummy pads DPs disposed outside a resistance measurement pad PDM-1. The dummy pads DPs are illustrated as three pads that are spaced apart from each other, and may be disposed between the arrangement pad PDA and the first pad P1. However, embodiments of the present inventive concept are not limited thereto and the number of pads of the dummy pads DPs may vary.

As shown in FIG. 8B, a circuit board CF-1 may include a resistance measurement lead LDM-1 including a plurality of dummy leads DLs. The dummy leads DLs are illustrated as three leads spaced apart from each other, and may be disposed between the arrangement lead LDA and the first lead L1. However, embodiments of the present inventive concept are not limited thereto and the number of leads of the plurality of dummy leads DLs may vary.

The arrangement pad PDA may be positioned in an area (indicated with a dotted line) in which any one among the driving evaluation pads PDC shown in FIG. 3A is removed. Accordingly, the number of the dummy pads DPs may be increased without changing the position of the existing pixel pads PD. Similarly, the arrangement lead LDA may be positioned in an area (indicated with a dotted line) in which any one among the driving evaluation leads LDC shown in FIG. 3A is removed. According to an embodiment of the present inventive concept, an interval PT_P between the arrangement pad PDA and the driving evaluation pad PDC or an interval PT_F between the arrangement lead LDA and the driving evaluation lead LDC may be substantially equal to each other. Accordingly, the number of the dummy leads DLs may be increased without changing the position of the existing pixel leads LD.

According to an embodiment of the present inventive concept, connection failure may be prevented from being generated between the resistance measurement pad PDM-1 and the resistance measurement lead LDM-1 by separating the positions of the resistance measurement pad PDM-1 and the resistance measurement lead LDM-1 from the arrangement pad PDA and the arrangement lead LDA. In addition, even in embodiments in which the connection failure is generated between the circuit board CF-1 and the electronic panel EP-1, an influence on the measurement of the connection resistance may be reduced by filling the area in which the connection failure is generated with the dummy pads DPs and the dummy leads DLs. Accordingly, the reliability in connection inspection may be increased between the circuit board CF-1 and the electronic panel EP-1.

In an embodiment of the present inventive concept, as shown in FIGS. 9A and 9B, dummy pads DPs-1 of an electronic panel EP-2 may be disposed around the arrangement pad PDA, and dummy leads DLs-1 of a circuit board CF-2 may be disposed around the arrangement lead LDA. The dummy pads DPs-1 may include at least one dummy pad DP1 disposed adjacent to an upper side of the arrangement pad PDA and at least one dummy pad DP2 disposed adjacent to a lower side thereof. The dummy leads DLs-1 may include at least one dummy lead DL1 disposed adjacent to an upper side of the arrangement lead LDA and at least one dummy lead DL2 disposed adjacent to a lower side thereof.

When the circuit board CF-2 is connected with the electronic panel EP-2, the dummy pads DPs-1 and the dummy leads DLs-1 may be connected with each other. However, since they have electrically floated patterns, the dummy pads DPs-1 and the dummy leads DLs-1 may not have an electrical influence on the surrounding pads. According to an embodiment of the present inventive concept, the dummy area AR (see FIG. 4C) may be filled with the dummy pads DPs-1 and the dummy leads DLs-1 Accordingly, even when a compression process by the bonding machine PS (see FIG. 5C) is performed, a deformation in the base film BF or the base substrate BS may be prevented. Accordingly, a connection failure may be prevented from being generated between the circuit board CF-2 and the electronic panel EP-2, and thus the reliability of resistance measurement inspection for the resistance measurement pad PDM-2 and the resistance measurement lead LDM-2 may be increased.

In an embodiment of the present inventive concept, as shown in FIGS. 10A and 10B, dummy pads DPs-2 of an electronic panel EP-3 and dummy leads DLs-2 of a circuit board CF-3 may be designed as various shapes of pads. For example, the dummy pads DPs-2 may include dummy pads DP3 disposed adjacent to an upper side of the arrangement pad DPA and having different shapes, and dummy pads DP4 disposed adjacent to a lower side thereof and having different shapes. For example, at least one of the dummy pads DP3 disposed on the upper side of the arrangement pad DPA may have a different shape from another of the dummy pads DP3 disposed on the upper side of the arrangement pad DPA. At least one of the dummy pads DP4 disposed on the lower side of the arrangement pad DPA may have a different shape from another of the dummy pads DP4 disposed on the lower side of the arrangement pad DPA. For example, the leftmost dummy pads of the upper and lower dummy pads DP3, DP4 in FIG. 10A have a different shape than the other dummy pads of the upper and lower dummy pads DP3, DP4, respectively. However, embodiments of the present inventive concept are not limited thereto. In correspondence thereto, the dummy leads DLs-2 may include dummy leads DL3 disposed adjacent to an upper side of the arrangement lead LDA and having different shapes, and dummy leads DL4 disposed adjacent to a lower side thereof and having different shapes.

When the circuit board CF-3 is connected with the electronic panel EP-3, the dummy pads DPs-2 and the dummy leads DLs-2 may be connected with each other. However, since the dummy pads DPs-2 and the dummy leads DLs-2 have electrically floated patterns, the dummy pads DPs-2 and the dummy leads DLs-2 may not have an electrical influence on the surrounding pads or leads. The dummy area AR may be filled with the dummy pads DPs-2 and the dummy leads DLs-2. Accordingly, a connection failure, such as due to non-compression, may be prevented from being indicated in a connection process of the circuit board CF-3 and the electronic panel EP-3. However, embodiments of the present inventive concept are not limited thereto. For example, in embodiments in which the dummy area AR and the surrounding area are equally compressed within the adhesive area ADA (see FIG. 5A), the dummy pads and the dummy leads may have various different shapes.

According to the present inventive concept, an error generation ratio may be reduced when a defective connection between the circuit board and the electronic panel is inspected. Accordingly, the reliability in contact resistance inspection may be increased between the circuit board and the electronic panel.

While the present inventive concept has been described with reference to embodiments thereof, it will be clear to those of ordinary skill in the art to which the present inventive concept pertains that various changes and modifications may be made to the described embodiments without departing from the spirit and technical scope of the present inventive concept. Thus, the scope of the present inventive concept shall not be restricted or limited by the foregoing description of embodiments thereof.

What is claimed is:

1. An electronic apparatus comprising:
    an electronic panel comprising a base substrate, a plurality of pixels on the base substrate, and a plurality of pads in an adhesive area, the plurality of pads is spaced apart from the plurality of pixels;
    a circuit board comprising a base film, and a plurality of leads disposed on the base film and overlapping the plurality of pads in a plan view; and
    a conductive adhesive member disposed on the adhesive area and configured to electrically connect the circuit board and the electronic panel,
    wherein the plurality of pads comprises a plurality of pixel pads electrically connected to the plurality of pixels, an arrangement pad spaced apart from the plurality of pixel pads, and a resistance measurement pad disposed between the arrangement pad and the plurality of pixels pads and insulated from the plurality of pixel pads, and
    the plurality of leads comprises a plurality of pixel leads overlapping the plurality of pixel pads in the plan view, an arrangement lead overlapping the arrangement pad in the plan view, and a resistance measurement lead disposed between the plurality of pixel leads and the arrangement lead and insulated from the plurality of pixel leads,
    wherein the resistance measurement lead comprises a plurality of resistance measurement leads disposed between the arrangement lead and the plurality of pixel leads and electrically connected to the resistance measurement pad, and a dummy lead spaced apart from each of the plurality of resistance measurement leads in the plan view.

2. The electronic apparatus according to claim 1, wherein:
    the resistance measurement lead comprises first, second, and third leads arranged along a direction from the arrangement lead towards the pixel leads; and
    the third lead is connected to a plurality of terminals.

3. The electronic apparatus according to claim 2, wherein the dummy lead is disposed between the first lead and the second lead.

4. The electronic apparatus according to claim 2, wherein the dummy lead is disposed between the first lead and the arrangement lead.

5. The electronic apparatus according to claim 2, wherein the resistance measurement pad comprises:
    a first pad connected with the first lead;
    a second pad connected with the second lead; and
    a third pad connected with the third lead,
    wherein the first to third pads are connected with each other.

6. The electronic apparatus according to claim 5, wherein the resistance measurement pad further comprises a dummy pad disposed between the first pad and the second pad and spaced apart from the first to third pads in the plan view,
    wherein the dummy pad overlaps the dummy lead in the plan view.

7. The electronic apparatus according to claim 6, wherein the dummy pad and the dummy lead are connected with each other through the conductive adhesive member.

8. The electronic apparatus according to claim 6, wherein a gap between the dummy pad and the dummy lead in a thickness direction of the electronic apparatus is larger than a gap between the pixel lead and the pixel pad in the thickness direction of the electronic apparatus.

9. The electronic apparatus according to claim 1, wherein the dummy lead comprises a first dummy lead and a second dummy lead spaced apart from each other with the arrangement lead disposed therebetween.

10. The electronic apparatus according to claim 9, wherein the first dummy lead includes a plurality of first dummy leads and the second dummy lead includes a plurality of second dummy leads,
    wherein at least one of the plurality of first dummy leads has a shape that is different from a shape of another first dummy lead of the plurality of first dummy leads, and
    wherein at least one of the plurality of second dummy leads has a shape that is different from a shape of another second dummy lead of the plurality of second dummy leads.

11. The electronic apparatus according to claim 9, wherein:
    the plurality of leads further comprises driving evaluation leads spaced apart from the arrangement lead and configured to receive an electrical signal; and
    the first dummy lead and the second dummy lead are disposed in an area surrounded by the resistance measurement lead, the arrangement lead, and the driving evaluation leads.

12. An electronic apparatus comprising:
    an electronic panel comprising a base substrate, a plurality of pixels on the base substrate, and a plurality of pads in an adhesive area, the plurality of pads are spaced apart from the plurality of pixels;
    a circuit board comprising a base film, and a plurality of leads disposed on the base film and overlapping the plurality of pads in a plan view; and
    a conductive adhesive member disposed on the adhesive area and configured to electrically connect the circuit board and the electronic panel,
    wherein the plurality of pads comprises:
        pixel pads electrically connected to the pixels and the circuit board;
        an arrangement pad electrically insulated from the pixel pads;
        resistance measurement pads insulated from the pixel pads, and electrically connected to the circuit board; and
        a dummy pad disposed between the arrangement pad and the pixel pads and spaced apart from the resistance measurement pads in the plan view.

13. The electronic apparatus according to claim 12, wherein:
    the resistance measurement pads comprise first, second, and third pads arranged along a direction from the arrangement pad toward the pixel pads; and
    the dummy pad is disposed between the first pad and the second pad.

14. The electronic apparatus according to claim 13, wherein:

the first to third pads are connected with each other; and
the dummy pad is spaced apart from the first to third pads.

15. The electronic apparatus according to claim 13, wherein the dummy pad is disposed between the first pad and the arrangement pad.

16. The electronic apparatus according to claim 13, wherein the dummy pad comprises:
   a first dummy pad disposed among the arrangement pad, the first pad, and the plurality of pixels; and
   a second dummy pad spaced apart from the first dummy pad with the arrangement pad disposed therebetween.

17. The electronic apparatus according to claim 13, wherein the plurality of leads comprises:
   first to third leads separately disposed from each other and respectively connected to the first to third pads; and
   a dummy lead overlapping the dummy pad in the plan view.

18. The electronic apparatus according to claim 17, wherein the dummy lead is connected with the dummy pad.

19. The electronic apparatus according to claim 17, wherein:
   at least one of the base film or the base substrate includes a deformation that is positioned in an area in which the dummy lead or the dummy pad is disposed; and
   the dummy lead is electrically insulated from the dummy pad.

20. The electronic apparatus according to claim 17, the third lead is connected to a plurality of terminals.

21. A combined electronic apparatus comprising:
   an electronic panel having a plurality of pixels in a display area and a plurality of pads in an adhesive area,
   a circuit board comprising a plurality of leads that overlap the plurality of pads in a plan view,
   a conductive adhesive member disposed on the adhesive area and configured to combine and electrically connect the circuit board and the electronic panel to each other;
   a measurement connection pattern formed by electrical connection of resistance measurement leads of the plurality of leads to resistance measurement pads of the plurality of pads,
   an arrangement pattern buried by an arrangement pad of the plurality of pads and an arrangement lead of the plurality of leads;
   at least one dummy lead on the circuit board and at least one dummy pad on the electronic panel, the at least one dummy lead and the at least one dummy pad overlap each other in the plan view and are electrically insulated from the plurality of leads and the plurality of pads,
   wherein the at least one dummy lead and the at least one dummy pad are disposed between the arrangement pattern and the measurement connection pattern to provide a predetermined minimum separation distance between the measurement connection pattern and the arrangement pattern.

22. The electronic apparatus of claim 21, further including:
   a dummy area that is disposed adjacent to the arrangement pattern, the dummy area having an increased susceptibility to deformations when the circuit board and the electronic panel are combined via the conductive adhesive member; and
   the at least one dummy lead and the at least one dummy pad are disposed in the dummy area.

* * * * *